(12) United States Patent
Sato et al.

(10) Patent No.: US 8,188,461 B2
(45) Date of Patent: May 29, 2012

(54) ORGANIC MEMORY DEVICE

(75) Inventors: Takehisa Sato, Isehara (JP); Kiyoshi Kato, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 723 days.

(21) Appl. No.: 11/437,819

(22) Filed: May 22, 2006

(65) Prior Publication Data

US 2006/0267068 A1 Nov. 30, 2006

(30) Foreign Application Priority Data

May 31, 2005 (JP) .................................. 2005-160352

(51) Int. Cl.
*H01L 51/00* (2006.01)
*H01L 27/28* (2006.01)
(52) U.S. Cl. ............ 257/40; 257/E51.003; 257/E27.117
(58) Field of Classification Search ........... 257/E25.008, 257/E27.117, E51.001, E51.002, E51.003, 257/E51.005
See application file for complete search history.

(56) References Cited

U.S. PATENT DOCUMENTS

| 6,312,983 B1 * | 11/2001 | Wu et al. ........................ 438/238 |
| 6,528,815 B1 | 3/2003 | Brown et al. |
| 6,950,331 B2 | 9/2005 | Yang et al. |
| 2004/0238864 A1 | 12/2004 | Tripsas et al. |
| 2005/0270822 A1 * | 12/2005 | Shrivastava et al. ........... 365/149 |
| 2006/0157772 A1 * | 7/2006 | Sumida et al. ................ 257/314 |

FOREIGN PATENT DOCUMENTS

| JP | 2001-244467 A | 9/2001 |
| JP | 2002-026277 | 1/2002 |
| JP | 2004-128471 A | 4/2004 |
| WO | 2004/015778 | 2/2004 |

OTHER PUBLICATIONS

"Office Action (Application No. 200610092480.4) Dated April 3, 2009,".

* cited by examiner

*Primary Examiner* — Tom Thomas
*Assistant Examiner* — Christopher M Roland
(74) *Attorney, Agent, or Firm* — Eric J. Robinson; Robinson Intellectual Property Law Office, P.C.

(57) ABSTRACT

When an electrode is formed over an organic layer, a temperature is limited because the organic layer can be influenced depending on a temperature in forming the electrode. Therefore, there are problems that an expected electrode cannot be formed, and miniaturization of an element is inhibited. The present invention provides a structure of an organic memory element in which two electrodes are provided in the same layer as two terminals of the memory element, and a layer containing an organic compound is provided between the electrodes. By narrowing a distance between the two electrodes, writing can be performed at low voltage. In addition, a structure of the memory element is simplified, and the area of the memory element can be reduced.

3 Claims, 17 Drawing Sheets

ORGANIC MEMORY DEVICE

BACKGROUND OF THE INVENTION

1. Field of the Invention

The present invention relates to a semiconductor device, particularly a semiconductor device which can store data by using an organic compound for a memory circuit.

In this specification, a semiconductor device generally means a device which can function by utilizing semiconductor characteristics, and an electrooptic device, a semiconductor circuit, and electronic equipment are all semiconductor devices.

2. Description of the Related Art

A memory element generally has a structure in which two electrodes are provided above and below a dielectric layer as two terminals of the memory element.

In Patent Document 1 (Japanese Patent Laid-Open No.: 2002-26277), a memory device is proposed, in which electrodes are provided above and below an organic layer as two terminals of an element, voltage is applied to cause short-circuit, and information is stored by setting an initial state to be "0" and a conducted state to be "1", and a method for driving the memory device is also proposed.

As a memory circuit provided in the semiconductor device, a DRAM (Dynamic Random Access Memory), an SRAM (Static Random Access Memory), an FeRAM (Ferroelectric Random Access Memory), a mask ROM (Read Only Memory), an EPROM (Electrically Programmable Read Only Memory), an EEPROM (Electrically Erasable and Programmable Read Only Memory), a flash memory, and the like are given. Among them, a DRAM and an SRAM are volatile memory circuits in which data is erased when power is turned off; therefore, it is necessary to write data every time the power is turned on. Although an FeRAM is a nonvolatile memory circuit, manufacturing steps thereof are increased because a capacitor element including a ferroelectric layer is used. A mask ROM has a simple structure; however, it is necessary to write data during manufacturing steps, and data cannot be additionally written. An EPROM, an EEPROM, and a flash memory are nonvolatile memory circuits; however, there is a problem that manufacturing steps thereof are increased because an element having two gate electrodes is used.

On the other hand, in a memory circuit using an organic compound for a dielectric substance, a memory element is formed by providing an organic compound between a pair of upper and lower electrodes. However, when the electrode is formed over an organic layer, a temperature is limited because the organic layer can be influenced depending on a temperature for forming the electrode. A forming method is limited due to this limitation of a temperature. Therefore, there are problems that an expected electrode cannot be formed, and miniaturization of an element is inhibited. A problem caused by an electrode formed over an organic layer is required to be solved from an aspect of inhibition of element miniaturization.

In addition, in a case of an organic memory element where a pair of electrodes is provided above and below an organic layer as two terminals, a pair of electrodes is required to be formed by a plurality of steps because a pair of electrodes is provided above and below. Therefore, there is a problem that a manufacturing process becomes complicated. The complicated manufacturing process is a problem that is required to be solved from an aspect of a manufacturing cost.

SUMMARY OF THE INVENTION

In view of the foregoing problems, it is an object of the present invention to overcome inhibition of element miniaturization and a complicated manufacturing process. It is another object of the present invention to provide a nonvolatile memory device in which data can be additionally written other than in manufacturing and forgery and the like due to rewriting can be prevented, and a semiconductor device including the memory device. In addition, it is also an object to provide a nonvolatile memory device and a semiconductor device which are highly reliable and inexpensive.

In view of the foregoing problems, the present invention provides a memory element in which a first conductive layer and a second conductive layer functioning as two terminals of the memory element are provided over the same insulating film.

In addition, in the present invention, there is a case where voltage is applied between two terminals of a memory element and a pair of electrodes is conducted horizontally by short-circuit of the electrodes, which is caused by a change of an organic layer. Further, voltage is applied parallel to a substrate surface to the organic layer, and a pair of electrodes is conducted.

According to a structure 1 of the invention that is disclosed in this specification, an example of which is shown in FIGS. 1A, 1B, and 1C, a semiconductor device includes a word line extending in a first direction, an insulating film covering the word line, an opening reaching the word line in the insulating film, a bit line extending in a second direction that is extend across the first direction over the insulating film, an electrode electrically connected to the word line through the opening over the insulating film, and a layer containing an organic compound between the side surface of the electrode and the side surface of the bit line opposing to the side surface of the electrode over the insulating film, where the electrode, the bit line, and the layer containing an organic compound form one memory element, and a plurality of the memory elements is provided.

In addition, in the structure 1, the electrode (also referred to as a word line electrode) and the bit line are formed by the same material and in the same chamber.

It is to be noted that an opening area (an area taken along a horizontal plane to the substrate surface) of the opening (also referred to as a contact hole) decreases from the opening upper end portion side toward the opening bottom surface side.

In addition, in the structure 1, the layer containing an organic compound is provided between the electrode, the bit line, and a pair of insulating materials provided over the insulating film, and the layer containing an organic compound is surrounded by the pair of the insulating materials, the electrode, and the bit line. The pair of the insulating materials is provided to control a position where the layer containing an organic compound is formed and also referred to as a partition wall. Further, the pair of the insulating materials is provided in a region between one memory element and an adjacent memory element.

The layer containing an organic compound may be in contact with at least a part of one side surface of the electrode and a part of the side surface of the bit line opposing to the one side surface of the electrode.

In addition, in the structure 1, as an example is shown in FIGS. 5A and 9A, the layer containing an organic compound covers both of the side surface and the upper end portion of the electrode, and both of the side surface and the upper end portion of the bit line opposing to the side surface of the electrode.

In addition, it is not limited to partially form the pair of the insulating materials, and as an example is shown in FIGS. 2A and 2B, a partition wall may be formed by removing a part of an insulating film after forming the insulating film over the entire surface. According to a structure 2 of the invention, a semiconductor device includes a word line extending in a first direction, a first insulating film covering the word line, a first opening reaching the word line in the first insulating film, a bit line extending in a second direction that is extend across the first direction over the first insulating film, an electrode electrically connected to the word line through the first opening over the first insulating film, a second insulating film including a second opening reaching both of one side surface of the electrode and the side surface of the bit line opposing to the one side surface of the electrode and covering the other side surface of the electrode, and a layer containing an organic compound between the side surface of the electrode and the side surface of the bit line opposing to the side surface of the electrode over the first insulating film, where the electrode, the bit line, and the layer containing an organic compound form one memory element, and a plurality of the memory elements is provided.

In addition, a structure may also be employed, in which the electrode connected to the word line is not formed over the first insulating film, and as an example is shown in FIGS. 3A and 3B, according to a structure 3 of the invention, a semiconductor device includes a word line extending in a first direction, a first insulating film covering the word line, a first opening reaching the word line in the first insulating film, a bit line extending in a second direction that is extend across the first direction over the first insulating film, a second insulating film including the first opening arranged inside, a second opening reaching one side surface of the bit line, and covering the other side surface of the bit line, and a layer containing an organic compound covering the one side surface of the bit line and the first opening over the first insulating film, where the word line, the bit line, and the layer containing an organic compound form one memory element, and a plurality of the memory elements is provided.

In addition, the layer containing an organic compound may also be provided to cover both side surfaces of the bit line and both side surfaces of the word line electrode without providing a partition wall, and as an example is shown in FIGS. 4A and 12A, according to a structure 4 of the invention, a semiconductor device includes a word line extending in a first direction, an insulating film covering the word line, an opening reaching the word line in the insulating film, a bit line extending in a second direction that is extend across the first direction over the insulating film, an electrode electrically connected to the word line through the opening over the insulating film, and a layer containing an organic compound covering the electrode, the bit line, and the opening over the insulating film, where the electrode, the bit line, and the layer containing an organic compound form one memory element, and a plurality of the memory elements is provided.

In addition, the layer containing an organic compound may also be formed to cover the side surface of the opening provided over the first insulating film, and as an example is shown in FIGS. 8A and 11A, according to a structure 5 of the invention, a semiconductor device includes a word line extending in a first direction, an insulating film covering the word line, an opening reaching the word line in the insulating film, a bit line extending in a second direction that is extend across the first direction over the insulating film, and a layer containing an organic compound covering one side surface of the bit line and the opening over the insulating film, where the word line, the bit line, and the layer containing an organic compound form one memory element, and a plurality of the memory elements is provided.

In addition, the layer containing an organic compound may also be selectively formed without providing a partition wall, and as an example is shown in FIGS. 6A and 10A, according to a structure 6 of the invention, a semiconductor device includes a word line extending in a first direction, an insulating film covering the word line, an opening reaching the word line in the insulating film, a bit line extending in a second direction that is extend across the first direction over the insulating film, an electrode electrically connected to the word line through the opening over the insulating film, and a layer containing an organic compound covering one side surface of the electrode, one side surface of the bit line, and the opening over the insulating film, where the electrode, the bit line, and the layer containing an organic compound form one memory element, and a plurality of the memory elements is provided.

In addition, in any one of the structures 1 to 6, the side surface of the electrode and the side surface of the bit line opposing to the side surface of the electrode have a tapered shape. In this specification, a tapered shape of the side surface of the electrode (or a wiring) means that the side wall surface of the electrode (or a wiring) is inclined. In this specification, a tapered shape does not mean a shape in which the upper end portion of the electrode (or a wiring) protrudes, that is, an overhang shape.

A manufacturing process to achieve the structure 1 is one of the present invention, and according to a structure of the invention relating to a manufacturing method, a method for manufacturing a semiconductor device includes the steps of forming a word line extending in a first direction over a substrate having an insulated surface, forming an insulating film covering the word line, forming a contact hole reaching the word line in the insulating film, forming a conductive film over the insulating film, forming a bit line extending in a second direction that is extend across the first direction and an electrode which covers the contact hole and is electrically connected to the word line over the insulating film by etching the conductive film, and forming a layer containing an organic compound between the side surface of the electrode and the side surface of the bit line opposing to the side surface of the electrode over the insulating film.

In the structure of the invention relating to the manufacturing method, the side surface of the bit line and the side surface of the electrode are formed to have a tapered shape in etching the conductive film.

In addition, the bit line and the word line may also be provided in a reverse order to the structure 1, and as an example is shown in FIG. 7A, according to a structure 7 of the invention, a semiconductor device includes a bit line extending in a first direction, an insulating film covering the bit line, an opening reaching the bit line in the insulating film, a word line extending in a second direction that is extend across the first direction over the insulating film, an electrode electrically connected to the bit line through the opening over the insulating film, and a layer containing an organic compound covering the electrode, the word line, and the opening over the insulating film, where the electrode, the word line, and the layer containing an organic compound form one memory element, and a plurality of the memory elements is provided.

In addition, in the structure 7, the side surface of the electrode and the side surface of the bit line opposing to the side surface of the electrode have a tapered shape.

A manufacturing process to achieve the structure 7 is one of the present invention, and according to a structure of the invention relating to a manufacturing method, a method for manufacturing a semiconductor device includes the steps of forming a bit line extending in a first direction over a substrate having an insulated surface, forming an insulating film covering the bit line, forming a contact hole reaching the bit line in the insulating film, forming a conductive film over the insulating film, forming a word line extending in a second direction that is extend across the first direction and an electrode which covers the contact hole and is electrically connected to the bit line over the insulating film by etching the conductive film, and forming a layer containing an organic compound at least between the side surface of the electrode and the side surface of the word line opposing to the side surface of the electrode over the insulating film.

In the structure of the invention relating to the manufacturing method, the side surface of the word line and the side surface of the electrode are formed to have a tapered shape in etching the conductive film.

By the present invention, advantageous effect such as miniaturization of an element and a simplified manufacturing process can be achieved.

In addition, a memory device and a semiconductor device according to the present invention includes a memory element having a simple structure in which an organic layer is interposed between a pair of electrodes over the same insulating film, and thus, an inexpensive memory device and semiconductor device can be provided.

DESCRIPTION OF THE INVENTION

Figure 1A:
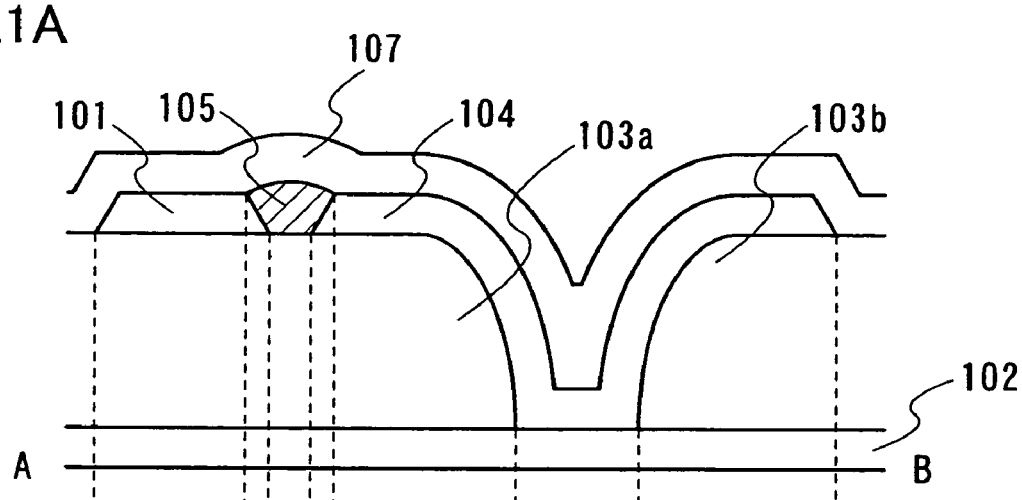
FIGS. 1A and 1C are cross-sectional views and FIG. 1B is a top view of a semiconductor device according to the present invention (Embodiment Mode 1)

Hereinafter, embodiment modes of the present invention will be described with reference to the drawings. However, it is to be easily understood by those skilled in the art that the present invention can be implemented in many different ways, and modes and details herein disclosed can be modified in various ways without departing from the purpose and the scope of the present invention. Therefore, the present invention should not be interpreted as being limited to the description of the embodiment modes to be given below. Through the drawings of the embodiment modes, the same components or components having the same functions are denoted by the same reference numerals and will not be further explained.

Embodiment Mode 1

In this embodiment mode, one example of a structure of a memory element included in a semiconductor device according to the present invention will be explained with reference to the drawings. More specifically, a case where a structure of a memory circuit provided with a plurality of memory elements is a passive matrix type will be shown.

Figure 1B:
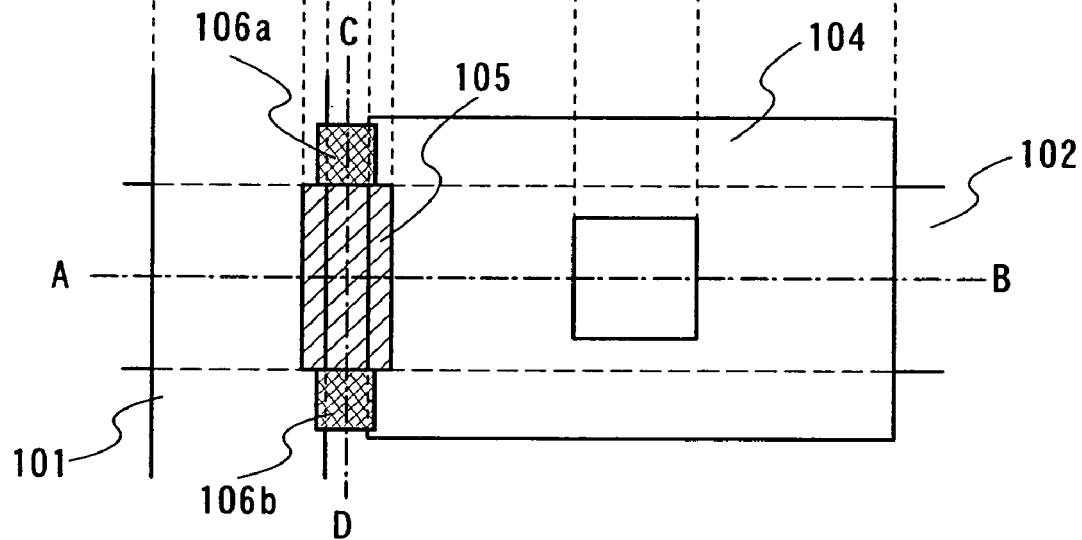
Figure 1C:
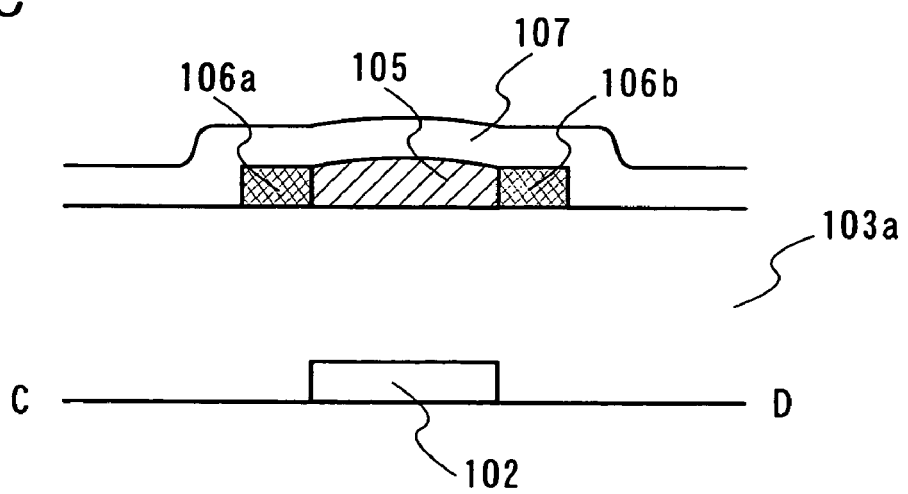

FIG. 1A shows a part of a cross-sectional structure of a memory cell array including a plurality of memory elements according to the present invention. FIG. 1B is a top structure, and a cross-section taken along a chain line A-B corresponds to FIG. 1A. Further, FIG. 1C shows a cross-sectional structure taken along a chain line C-D in FIG. 1B.

In FIG. 1A, a word line 102 is provided over a substrate having an insulated surface, and first insulating layers 103a and 103b are provided over the word line 102. The first insulating layers 103a and 103b have a film thickness of 0.8 to 1.5 μm, which is extend across the substrate surface.

The first insulating layers 103a and 103b are formed by using the same material, in which an opening (a contact hole) that reaches the word line 102 is provided. A word line electrode 104 is provided so as to cover the opening. In addition, the word line electrode 104, which is electrically connected to the word line 102 through the opening, is provided over the first insulating layers 103a and 103b. In FIG. 1A, the word line electrode 104 and a bit line 101 are provided in the same layer, that is, over the first insulating layer 103a.

The word line 102 is a control signal line for selecting one row from the memory cell array. In the memory cell array, a plurality of memory cells is arranged in matrix. One memory cell is arranged in the vicinity of an intersecting point of the word line 102 and the bit line 101, and reading or wiring can be performed by increasing voltage of a word line corresponding to an address to which reading or writing is performed.

In addition, the bit line 101 is a signal line for taking out data from the memory cell array. A memory cell connected to the word line 102 to which voltage is applied reads out data by outputting data stored in a memory element to the bit line 101.

Further, a layer 105 containing an organic compound is provided between the word line electrode 104 and the bit line 101. A memory element of the present invention is formed by the layer 105 containing an organic compound, and the word line electrode 104 and the bit line 101, which interpose the layer 105 containing an organic compound in a direction that is horizontal to the substrate surface. The layer 105 containing an organic compound can be formed by using a substance in which a crystal condition, conductivity, and a shape are changed by electric action, typically, a layer formed of an organic compound, an inorganic compound, or a mixture of an organic compound and an inorganic compound.

A memory element having the structure as described above can store two values corresponding to "initial state" and "state after conductivity change" because conductivity is changed by electric action. It is to be noted that the electric action means that voltage is applied to the bit line (bit line electrode) and the word line electrode so that current flows through the layer containing an organic compound.

Here, change in conductivity of the memory element before and after applying voltage is explained.

When voltage is applied between the side surface of the bit line 101 and the side surface of the word line electrode 104, characteristics of the layer 105 containing an organic compound are changed, and conductivity of the memory element becomes higher. In addition, when voltage is applied between the side surface of the bit line 101 and the side surface of the word line electrode 104, the bit line 101 and the word line electrode 104 are short-circuited in some cases. Further, when voltage is applied between the side surface of the bit line 101 and the side surface of the word line electrode 104, there is also a case where dielectric breakdown is caused in the layer 105 containing an organic compound and conductivity is obtained. This is because an electric field tends to be concentrated on the end portion of the electrode and dielectric breakdown is easily caused in the organic layer. In any case, two values corresponding to "initial state" and "state after conductivity change" can be stored because conductivity is changed by electric action.

As an organic compound that can be included in the layer 105 containing an organic compound, in which conductivity is changed by electric action from the outside, an organic compound having a high hole-transporting property or an organic compound having a high electron-transporting property can be used.

As the organic compound having a high hole-transporting property, an aromatic amine-based (namely, including a benzene ring-nitrogen bond) compound such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4"-tris(N,N-diphenyl-amino)-triphenylamine (abbreviated to TDATA), 4,4',4"-tris[N-(3-methylphenyl)-N-phenyl-amino]-triphenylamine (abbreviation: MTDATA), or 4,4'-bis(N-(4-(NN-di-m-tolylamino)phenyl)-N-phenylamino)biphenyl (abbreviation: DNTPD), or a phthalocyanine compound such as phthalocyanine (abbreviation: $H_2Pc$), copper phthalocyanine (abbreviation: CuPc), or vanadyl phthalocyanine (abbreviation: VOPc) can be used. The substances described here are mainly substances having hole mobility of $10^{-6}$ $cm^2/Vs$ or more. However, a substance other than the substances as described above may be used as long as the substance has a higher transporting property of holes than that of electrons.

In a case of providing a mixed layer of an organic compound and an inorganic compound as the layer containing an organic compound, it is preferable to mix an organic compound having a high hole-transporting property and an inorganic compound which easily receives electrons. In accordance with the above described structure, a number of hole carriers are generated in an organic compound which has originally few inherent carriers, and a hole injecting property and transporting property which are extremely excellent are exhibited. As a result, the layer containing an organic compound can obtain excellent conductivity.

As the inorganic compound which easily receives electrons, metal oxide, metal nitride, or metal oxynitride of a transition metal which belongs to any of Group 4 to Group 12 in the periodic table can be used. Specifically, titanium oxide (TiOx), zirconium oxide (ZrOx), vanadium oxide (VOx), molybdenum oxide (MoOx), tungsten oxide (WOx), tantalum oxide (TaOx), hafnium oxide (HfOx), niobium oxide (NbOx), cobalt oxide (Cox), rhenium oxide (ReOx), ruthenium oxide (RuOx), zinc oxide (ZnO), nickel oxide (NiOx), copper oxide (CuOx), or the like can be used. Although oxide is given as a specific example here, nitride or oxynitride thereof may be used as a matter of course.

As the organic compound having a high electron-transporting property, a material formed of a metal complex having a quinoline skeleton or a benzoquinoline skeleton or the like, such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq) can be used. In addition, a material such as a metal complex having an oxazole-based or thiazole-based ligand, such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$) can be used. Furthermore, in addition to a metal complex, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like can be used. The substances described here are mainly substances having electron mobility of $10^{-6}$ $cm^2/Vs$ or more. However, a substance other than the substances as described above may also be used as long as the substance has a higher transporting property of electrons than that of holes.

In a case of providing a mixed layer of an organic compound and an inorganic compound, it is preferable to mix an organic compound having a high electron-transporting property and an inorganic compound which easily donates electrons. In accordance with the above described structure, a number of electron carriers are generated in an organic compound which has originally few inherent carriers, and an electron injecting property and transporting property which are extremely excellent are exhibited. As a result, an organic compound layer can obtain excellent conductivity.

As the inorganic compound which easily donates electrons, alkali metal oxide, alkaline earth metal oxide, rare-earth metal oxide, alkali metal nitride, alkaline earth metal nitride, or rare-earth metal nitride can be used. Specifically, lithium oxide (LiOx), strontium oxide (SrOx), barium oxide (BaOx), erbium oxide (ErOx), sodium oxide (NaOx), lithium nitride (LiNx), magnesium nitride (MgNx), calcium nitride, yttrium nitride (YNx), lanthanum nitride (LaNx), or the like can be used.

Further, as the inorganic compound, any inorganic compound may be used as long as the inorganic compound easily receives electrons from an organic compound or the inorganic compound easily donates electrons to an organic compound, and various metal oxide, metal nitride, or metal oxynitride can be used in addition to aluminum oxide (AlOx), gallium oxide (GaOx), silicon oxide (SiOx), germanium oxide (GeOx), indium tin oxide (ITO), or the like.

In addition, in a case where the layer 105 containing an organic compound is formed by a compound of metal oxide or metal nitride and a compound having a high hole-transporting property, a compound having large steric hindrance (having not a planar structure but a spatial structure) may be further added. As the compound having large steric hindrance, 5,6,11,12-tetraphenyltetracene (abbreviation: rubrene) is preferable. Alternatively, hexaphenylbenzene, t-butylperylene, 9,10-di(phenyl)anthracene, coumarin 545T, or the like can be used. Further, dendrimer or the like is also effective.

Furthermore, a light emitting substance such as 4-dicyanomethylene-2-methyl-6-[2-(1,1,7,7-tetramethyljulolidin-9-yl)ethenyl]-4H-pyran (abbreviation: DCJT), 4-dicyanomethylene-2-t-butyl-6-[2-(1,1,7,7-tetramethyljulolidn-9-yl) ethenyl]-4H-pyran, periflanthene, 2,5-dicyano-1,4-bis[2-(10-methoxy-1,1,7,7-tetramethyljulolidin-9-yl)ethenyl] benzene, N,N'-dimethylquinacridone (abbreviation: DMQd), coumarin 6, coumarin 545T, tris(8-quinolinolato)aluminum (abbreviated to $Alq_3$), 9,9'-bianthryl, 9,10-diphenylanthracene (abbreviation: DPA), 9,10-di(2-naphthyl)anthracene (abbreviation: DNA), or 2,5,8,11-tetra-t-butylperylene (abbreviation: TBP) may be provided between a layer formed by an organic compound having a high electron-transporting property and a layer formed by an organic compound having a high hole-transporting property.

The layer 105 containing an organic compound can be formed by an evaporation method, an electron beam evaporation method, a sputtering method, a CVD method, or the like. The mixed layer containing an organic compound and an inorganic compound can be formed by depositing each material at the same time and can be formed by combining the same type of methods or different types of methods, such as co-evaporation by resistance-heating evaporations, co-evaporation by electron beam evaporations, co-evaporation by resistance-heating evaporation and electron beam evaporation, deposition by resistance-heating evaporation and sputtering, or deposition by electron beam evaporation and sputtering.

In addition, as another method for forming the layer 105 containing an organic compound, spin coating, a sol-gel method, a printing method, a droplet-discharge method, or the like may be used, or a combination of the above-described method and these methods may also be used.

The layer 105 containing an organic compound has such a film thickness that conductivity of a memory element is changed by electric action from the outside. The typical film thickness of the layer 105 containing an organic compound is 5 to 100 nm, preferably, 10 to 60 nm.

As shown in FIG. 1A, the layer 105 containing an organic compound is in contact with one side surface (a tapered side surface) of the word line electrode 104. Further, the side surface of the bit line 101 opposing to the side surface of the word line electrode 104 that is in contact with the layer 105 containing an organic compound is also in contact with the layer 105 containing an organic compound.

In addition, as shown in FIGS. 1B and 1C, second insulating layers 106a and 106b are arranged so as to interpose the layer 105 containing an organic compound. The second insulating layers 106a and 106b are formed to have a film thickness of 0.1 to 0.5 μm, which is extend across the substrate surface. Since an organic material used for the layer 105 containing an organic compound is surrounded by the word line electrode 104, the bit line 101, and the second insulating layers 106a and 106b as shown in FIG. 1B, a material having high fluidity can also be used.

In FIG. 1B, a top side shape of the layer 105 containing an organic compound is rectangular, but it may be square, elliptical or circular without particular limitations. The top side shape of the layer 105 containing an organic compound can be easily controlled by a deposition method. For example, when an evaporation mask having a rectangular opening is used in a case of a resistance heating evaporation method or an electron beam evaporation method, a layer 105 containing an organic compound with a rectangular shape can be obtained. In this manner, when the layer 105 containing an organic compound is formed separately for each memory cell, an influence of an electric field in a horizontal direction can be reduced between adjacent memory cells.

In order to reduce the number of manufacturing steps, it is preferable to form the word line electrode 104 and the bit line 101 in the same step. Further, in order to control a distance between the word line electrode 104 and the bit line 101 with high accuracy, it is preferable to pattern the word line electrode 104 and the bit line 101 using the same photomask.

A distance between the word line electrode 104 and the bit line 101 that are formed over the same insulating layer is desirably 0.1 to 0.05 μm, preferably 0.01 μm or less in a length that is horizontal to the substrate surface. Writing can be performed at low voltage by narrowing the distance between the word line electrode 104 and the bit line 101. In other words, writing can be performed with low power consumption.

The word line 102, the bit line 101, and the word line electrode 104 are formed by an evaporation method, a sputtering method, a CVD method, a printing method, an electroplating method, an electroless plating method, a droplet-discharge method, or the like. The present invention is particularly effective in a case where a material having a low allowable temperature limit is used as a material for the layer 105 containing an organic compound. In the present invention, since the word line 102, the bit line 101 and the word line electrode 104 are formed before the layer 105 containing an organic compound, there is an advantage that a method for forming a wiring to be used and a deposition temperature are not particularly limited and various methods can be used.

The word line 102, the bit line 101, and the word line electrode 104 are formed by using a highly conductive element, compound, or the like. Typically, a structure including an element selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), and the like, or an alloy containing a plurality of the elements can be employed. As the alloy containing a plurality of the elements, for example, an alloy containing Al and Ti, an alloy containing Al, Ti and C, an alloy containing Al and Ni, an alloy containing Al and C, an alloy containing Al, Ni, and C, an alloy containing Al and Mo, or the like can be used.

In addition, the word line 102, the bit line 101, and the word line electrode 104 may be formed by using different materials from each other. Further, wirings of the word line 102, the bit line 101, and the word line electrode 104 may be formed by different methods from each other as well.

By appropriately adjusting an etching condition in patterning, the bit line 101 and the word line electrode 104 having a tapered side surface can be formed. When the bit line 101 and the word line electrode 104 are formed in the same step, tapered shapes of the bit line 101 and the word line electrode 104 are the same. The tapered shape means that a cross-section of the electrode side surface is inclined. The side surfaces of the bit line 101 and the word line electrode 104 preferably have an inclined angle of 10° or more and less than 85°, more preferably 60° or more and 80° or less with respect to the substrate surface.

FIG. 1A shows an example in which the bit line 101 is provided above the word line 102; however, the formation order is not particularly limited, and the word line may be provided above the bit line. When the word line is provided above the bit line, a structure is employed, in which a bit line electrode that is electrically connected to a bit line through an opening in a first insulating layer is provided, and a layer containing an organic compound is provided between the bit line electrode and the word line.

The memory element shown in FIGS. 1A, 1B, and 1C has a structure in which voltage is applied to the layer 105 containing an organic compound in a direction that is horizontal to the substrate surface, and an area of the memory element can be reduced by narrowing the distance between the word line electrode 104 and the bit line 101.

Hereinafter, one example of a method for manufacturing the memory element shown in FIGS. 1A, 1B, and 1C is explained.

First, the word line 102 is formed over the substrate plane.

Subsequently, a first insulating film is formed over the word line 102. Then, the opening that reaches the word line 102 is formed by selectively etching the first insulating film using a photolithography method or the like. In a cross-section taken along a plane, which includes and is parallel to the word line, the insulating film on one side is referred to as the first insulating layer 103a and the insulating film on the other side is referred to as the first insulating layer 103b. It is to be noted that the first insulating layers 103a and 103b can be formed without etching when a printing method or a droplet-discharge method is used.

Then, a conductive film is formed by a sputtering method and etched selectively by using a photolithography method or the like to form the bit line 101 over the first insulating layer 103a and the word line electrode 104 over the first insulating layers 103a and 103b. The bit line 101 and the word line electrode 104 are desirably formed to be thick because a material solution containing an organic compound is dropped in a subsequent step.

Next, a second insulating film is formed and etched selectively by using a photolithography method or the like to form the second insulating layers 106a and 106b. Each of the second insulating layers 106a and 106b is in contact with one side surface of the bit line 101 and the side surface of the word line electrode 104 opposing to the one side surface of the bit line 101. The second insulating layers 106a and 106b are arranged so as to interpose a position where a material solution containing an organic compound is dropped in a subsequent step. It is to be noted that the second insulating layers 106a and 106b can be formed without etching when a printing method or a droplet-discharge method is used.

Then, a material solution containing an organic compound is dropped to a region surrounded by the bit line 101, the word line electrode 104, and the second insulating layers 106a and 106b by using a droplet-discharge method. The material solution containing an organic compound is dropped so as to fill in at least a space between the bit line 101 and the word line electrode 104. The dropped material solution containing an organic compound is fixed because it is surrounded by the bit line 101, the word line electrode 104, and the second insulating layers 106a and 106b. Then, baking is performed to form the layer 105 containing an organic compound.

Finally, a protective layer 107 is formed to cover the bit line 101, the word line electrode 104, the first insulating layers 103a and 103b, the second insulating layers 106a and 106b, and the layer 105 containing an organic compound. The protective layer 107 is not required to be provided if not necessary. The protective layer 107 is an insulating film formed by using an evaporation method, an electron beam evaporation method, a sputtering method, a CVD method, a spin coating method, a sol-gel method, a printing method, a droplet-discharge method, or the like. It is preferable that the layer 105 containing an organic compound be not damaged when the protective layer 107 is formed.

In the memory element shown in FIGS. 1A, 1B, and 1C that is obtained as described above, the word line electrode 104 and the bit line 101 which interpose the layer 105 containing an organic compound can be formed at the same time, and thus, the steps can be shortened.

Figure 2A:
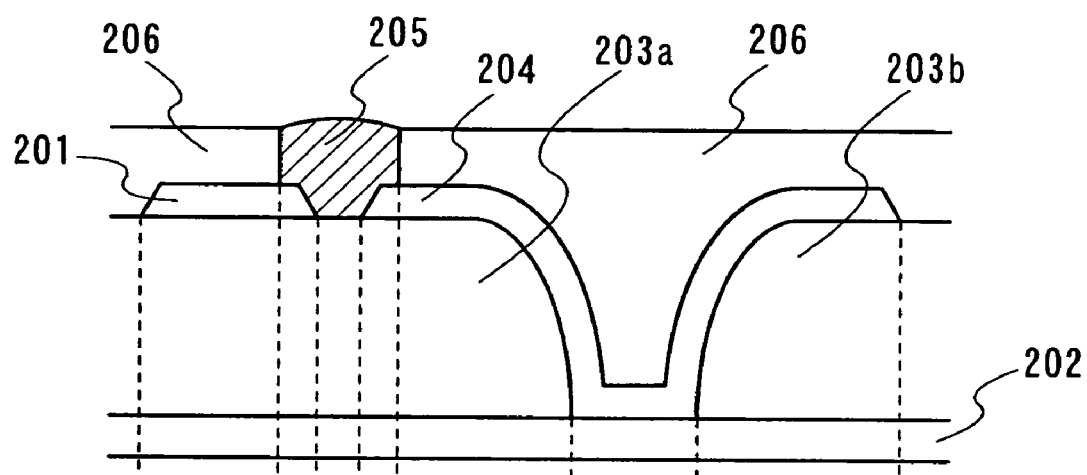
FIG. 2A is a cross-sectional view and FIG. 2B is a top view of a semiconductor device according to the present invention (Embodiment Mode 1)
Figure 2B:
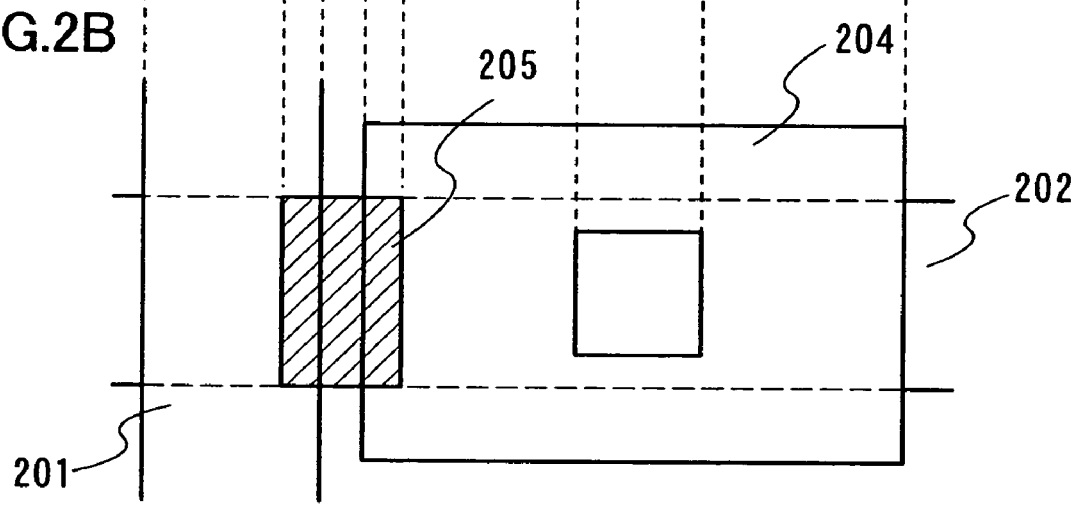

FIGS. 2A and 2B show an example of a memory element which is partially different from the memory element shown in FIGS. 1A, 1B and 1C. FIG. 2A is a cross-sectional view of the memory element, and FIG. 2B is a top view corresponding to FIG. 2A.

In FIG. 2A, similarly to FIG. 1A, a word line 202 is provided over a substrate having an insulated surface, and first insulating layers 203a and 203b are provided over the word line 202. The first insulating layers 203a and 203b are formed by using the same material, in which an opening (a contact hole) that reaches the word line 202 is provided. A word line electrode 204 is provided so as to cover the opening. In addition, the word line electrode 204, which is electrically connected to the word line 202 through the opening, is provided over the first insulating layers 203a and 203b. The word line electrode 204 and a bit line 201 are provided in the same layer, that is, over the first insulating layer 203a.

Further, a second insulating layer 206 is provided, which covers a region except for the side surface of the word line electrode 204 and the side surface of the bit line 201 opposing to the side surface of the word line electrode 204.

The memory element shown in FIG. 2A has a structure in which an area of the second insulating layer 206 is larger compared with the second insulating layers 106a and 106b in FIG. 1A.

A layer 205 containing an organic compound is surrounded by the second insulating layer 206. In other words, the layer 205 containing an organic compound is fixed by adjusting a film thickness of the second insulating layer 206. Therefore, in FIG. 2A, the bit line 201 and the word line electrode 204 can be formed to be thinner than that in the memory element shown in FIG. 1A. When the bit line 201 and the word line electrode 204 are formed to be thinner, deposition time and etching time can be shortened.

Further, when a material solution is dropped to a region surrounded by the second insulating layer 206 by a droplet-discharge method, a material solution with comparatively high fluidity can also be kept in a dropped portion.

In addition, as shown in FIG. 2B, a concave portion due to the opening that reaches the word line 202 can be planarized by the second insulating layer 206.

In addition, in the memory element shown in FIG. 2A, a protective layer may also be provided to cover the second insulating layer 206 and the layer 205 containing an organic compound.

FIG. 2A also shows an example in which the bit line 201 is provided above the word line 202; however, the formation order is not particularly limited, and the word line may be provided above the bit line. When the word line is provided above the bit line, a structure is employed, in which a bit line electrode that is electrically connected to a bit line through an opening in a first insulating layer is provided, and a layer containing an organic compound is provided between the bit line electrode and the word line.

Embodiment Mode 2

Figure 3A:
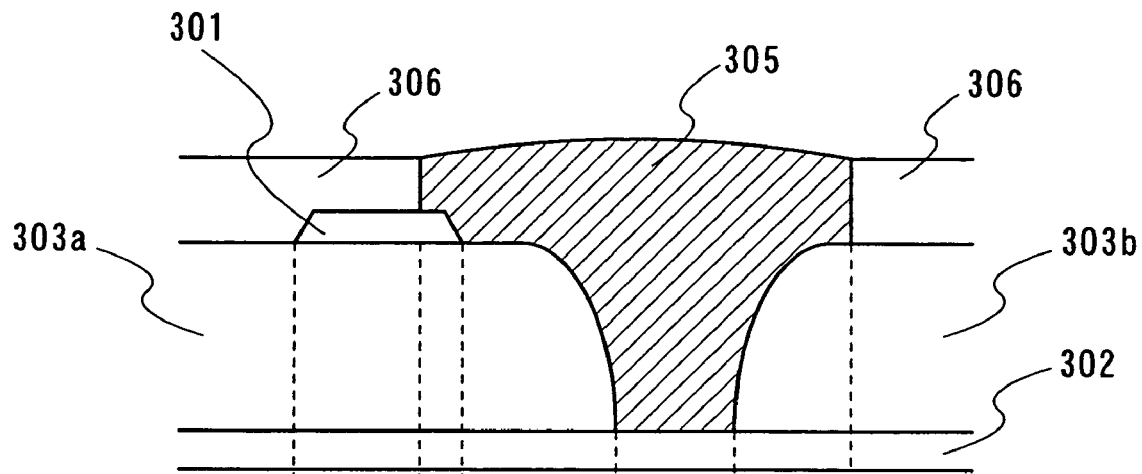
FIG. 3A is a cross-sectional view and FIG. 3B is a top view of a semiconductor device according to the present invention (Embodiment Mode 2)
Figure 3B:
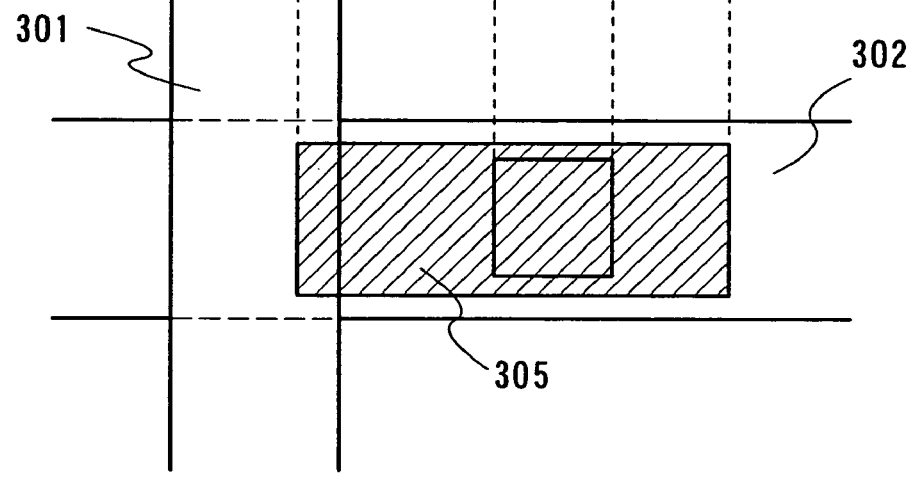

In this embodiment mode, FIGS. 3A and 3B show an example of a memory element which is partially different from the memory element shown in FIGS. 1A, 1B and 1C. FIG. 3A is a cross-sectional view of the memory element, and FIG. 3B is a top view corresponding to FIG. 3A.

In FIG. 3A, similarly to FIG. 1A, a word line 302 is provided over a substrate having an insulated surface, and first insulating layers 303a and 303b are provided over the word line 302. The first insulating layers 303a and 303b are formed by using the same material, in which an opening (a contact hole) that reaches the word line 302 is provided. A bit line 301 is provided over the first insulating layer 303a.

In FIG. 3A, the word line electrode 104 shown in FIG. 1A is not provided. Therefore, further simplification of an element structure can be achieved, and downsizing of a memory cell can also be achieved. In FIG. 3A, a layer 305 containing an organic compound is provided to cover the opening that reaches the word line 302 and the side surface of the bit line 301, which is close to the opening. The layer 305 containing an organic compound is surrounded by a second insulating layer 306.

The second insulating layer 306 covers a region except for the side surface of the bit line 301, which is close to the opening.

It is to be noted that an area of the opening surrounded by the first insulating layers 303a and 303b (the area taken along a horizontal plane to the substrate surface) decreases from the opening upper end portion side toward the opening bottom surface side.

A distance between the bit line 301 and the opening bottom surface is desirably 0.1 to 0.05 µm, preferably 0.01 µm or less in a length that is horizontal to the substrate surface. When voltage is applied between the bit line 301 and the word line 302, current flows along the curved surface of the side wall of the first insulating layer 303a through the layer 305 containing an organic compound.

In addition, in the memory element shown in FIG. 3A, a protective layer may also be provided to cover the second insulating layer 306 and the layer 305 containing an organic compound.

FIG. 3A also shows an example in which the bit line 301 is provided above the word line 302; however, the formation order is not particularly limited, and the word line may be provided above the bit line.

This embodiment mode can be arbitrarily combined with Embodiment Mode 1.

Embodiment Mode 3

Figure 4A:
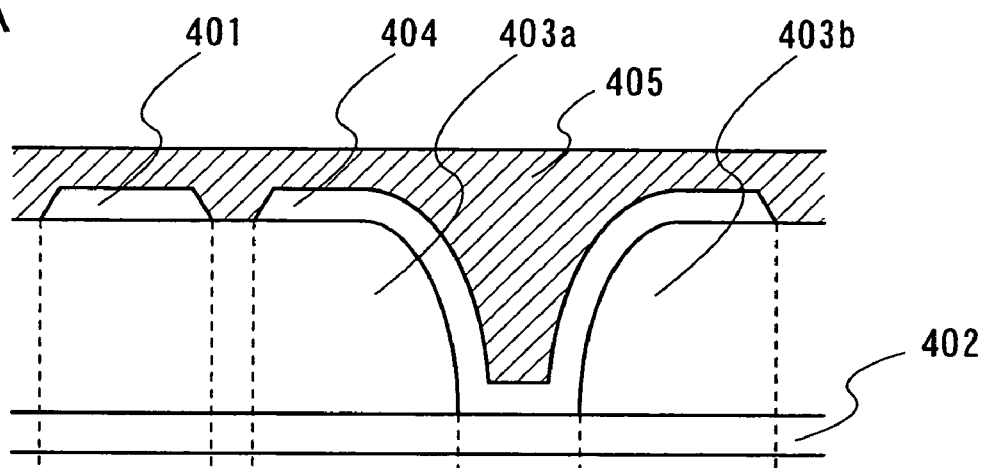
FIG. 4A a cross-sectional view and FIG. 4B is a top view of a semiconductor device according to the present invention (Embodiment Mode 3)
Figure 4B:
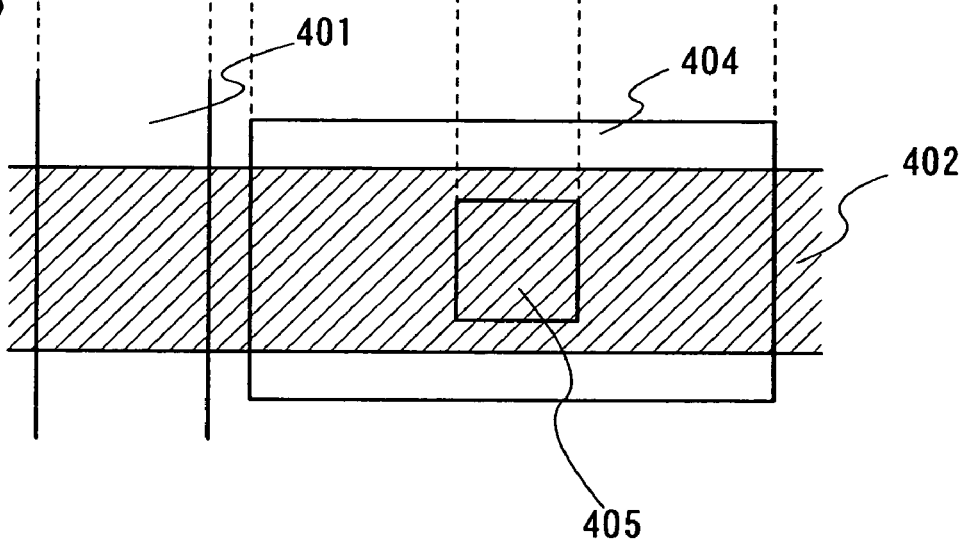

In this embodiment mode, FIGS. 4A and 4B show an example of a memory element which is partially different from the memory element shown in FIGS. 1A, 1B and 1C. FIG. 4A is a cross-sectional view of the memory element, and FIG. 4B is a top view corresponding to FIG. 4A.

In FIG. 4A, similarly to FIG. 1A, a word line 402 is provided over a substrate having an insulated surface, and first insulating layers 403a and 403b are provided over the word line 402. The first insulating layers 403a and 403b are formed by using the same material, in which an opening (a contact hole) that reaches the word line 402 is provided. A word line electrode 404 is provided so as to cover the opening. In addition, the word line electrode 404, which is electrically connected to the word line 402 through the opening, is provided over the first insulating layers 403a and 403b. The word line electrode 404 and a bit line 401 are formed in the same layer, that is, over the first insulating layer 403a.

In the memory element shown in FIG. 4A, a layer 405 containing an organic compound covers both side surfaces of the word line electrode 404 and both side surfaces of the bit line 401.

Further, as shown in FIG. 4B, the layer 405 containing an organic compound is formed in a band-shape (also referred to as a line-shape). In addition, a second insulating layer may also be formed to fix the layer 405 containing an organic compound. In such a case, the second insulating layer is also formed in a band-shape (also referred to as a line-shape) parallel to the layer 405 containing an organic compound.

FIG. 4B shows an example in which the width of the layer 405 containing an organic compound is narrower than that of the word line electrode 404; however, it is not particularly limited, and the width of the layer 405 containing an organic compound may also be wider than that of the word line electrode 404.

The memory element shown in FIGS. 4A and 4B has a structure in which the layer 405 containing an organic compound has a top side shape that is different from that of the layer 105 containing an organic compound shown in FIG. 1A. The memory element shown in FIGS. 4A and 4B has a structure in which the width of the layer 405 containing an organic compound can be made wide, and thus, an allowable range of misalignment in forming the layer 405 containing an organic compound can be made wide.

In addition, in the memory element shown in FIG. 4A, a protective layer may also be provided to cover the bit line 401, the word line electrode 404, the first insulating layers 403a and 403b, and the layer 405 containing an organic compound.

FIG. 4A also shows an example in which the bit line 401 is provided above the word line 402; however, the formation order is not particularly limited, and the word line may be provided above the bit line.

This embodiment mode can be arbitrarily combined with Embodiment Mode 1 or 2.

Embodiment Mode 4

Figure 5A:
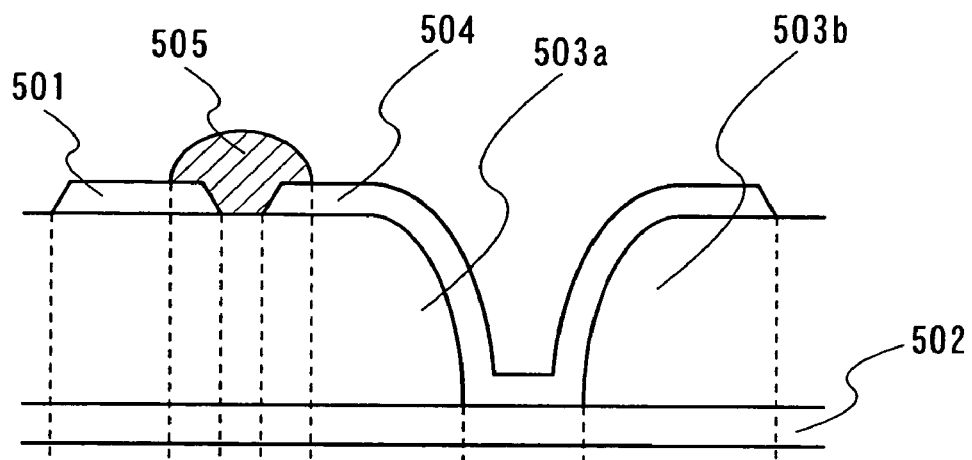
FIG. 5A is a cross-sectional view and FIG. 5B is a top view of a semiconductor device according to the present invention (Embodiment Mode 4)
Figure 5B:
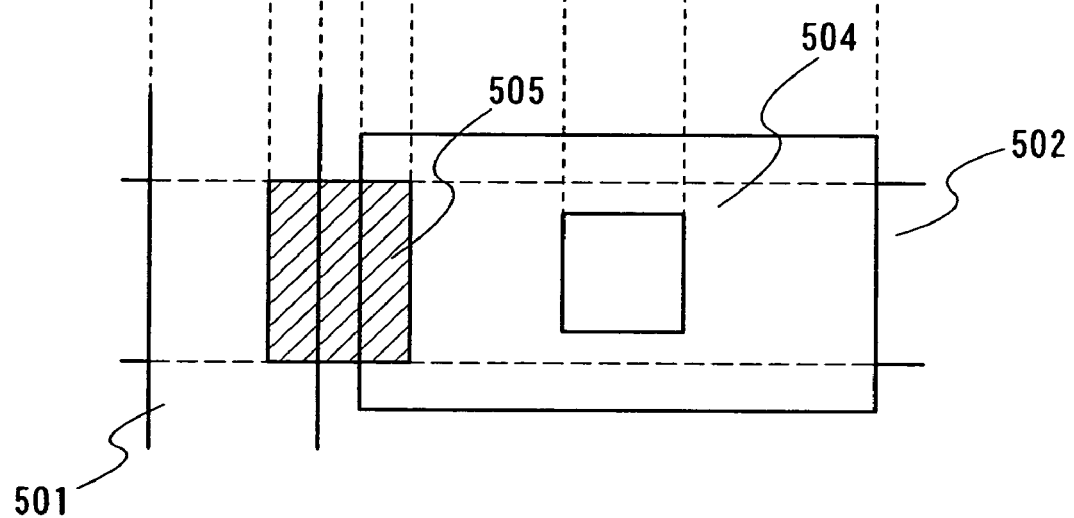

In this embodiment mode, FIGS. 5A and 5B show an example of a memory element which is partially different from the memory element shown in FIGS. 1A, 1B and 1C. FIG. 5A is a cross-sectional view of the memory element, and FIG. 5B is a top view corresponding to FIG. 5A.

In FIG. 5A, similarly to FIG. 1A, a word line 502 is provided over a substrate having an insulated surface, and first insulating layers 503a and 503b are provided over the word line 502. The first insulating layers 503a and 503b are formed by using the same material, in which an opening (a contact hole) that reaches the word line 502 is provided. A word line electrode 504 is provided so as to cover the opening. In addition, the word line electrode 504, which is electrically connected to the word line 502 through the opening, is provided over the first insulating layers 503a and 503b. The word line electrode 504 and a bit line 501 are provided in the same layer, that is, over the first insulating layer 503a.

The memory element shown in FIGS. 5A and 5B has a structure in which a layer 505 containing an organic compound has a cross-sectional shape that is different from that of the layer 105 containing an organic compound shown in FIG. 1A. FIG. 1A shows an example in which the layer 105 containing an organic compound is in contact with only the side surface of the word line electrode 104; however, in FIG. 5A, the layer 505 containing an organic compound is in contact with both of the side surface and a part of the top surface (top end portion) of the word line electrode 504.

A material which can be easily hardened is desirably used for the layer 505 containing an organic compound. By using the material which can be easily hardened, the second insulating layers 106a and 106b shown in FIG. 1B are not required to be provided. Further, by using the material which can be easily hardened, the bit line 501 and the word line electrode 504 can be made to be thinner than that of the bit line 101 and the word line electrode 104 shown in FIG. 1A.

In addition, in the memory element shown in FIG. 5A, a protective layer may also be provided to cover the bit line 501, the word line electrode 504, the first insulating layers 503a and 503b, and the layer 505 containing an organic compound.

FIG. 5A also shows an example in which the bit line 501 is provided above the word line 502; however, the formation order is not particularly limited, and the word line may be provided above the bit line.

This embodiment mode can be arbitrarily combined with Embodiment Mode 1, 2 or 3.

Embodiment Mode 5

Figure 6A:
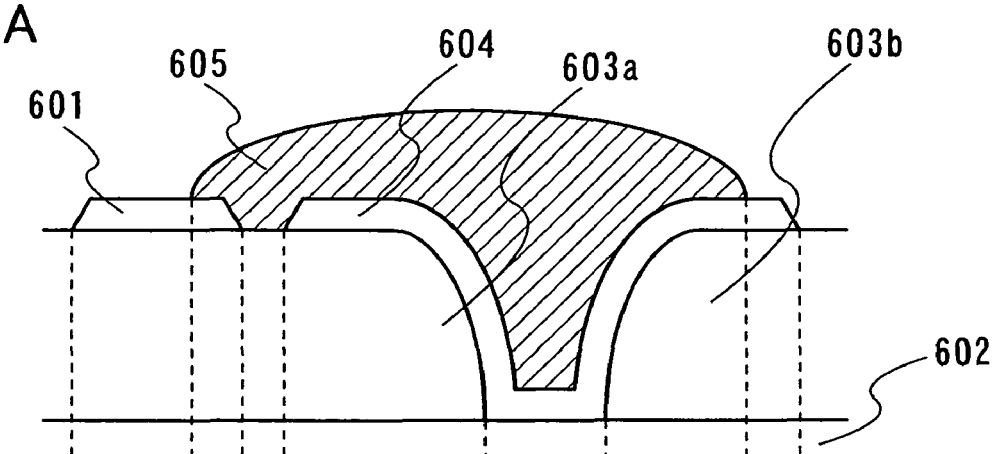
FIG. 6A is a cross-sectional view and FIG. 6B is a top view of a semiconductor device according to the present invention (Embodiment Mode 5)
Figure 6B:
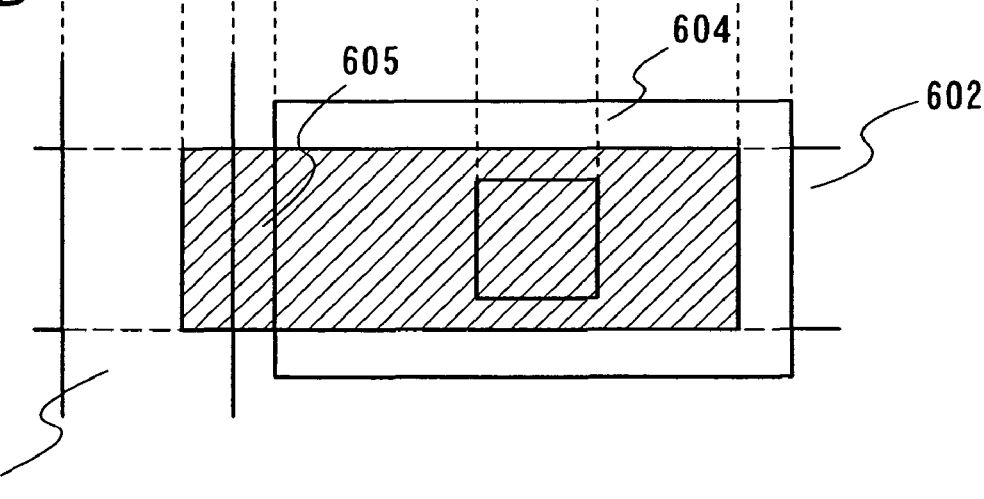

In this embodiment mode, FIGS. 6A and 6B show an example of a memory element which is partially different from the memory element shown in FIGS. 1A, 1B and 1C. FIG. 6A is a cross-sectional view of the memory element, and FIG. 6B is a top view corresponding to FIG. 6A.

In FIG. 6A, similarly to FIG. 1A, a word line 602 is provided over a substrate having an insulated surface, and first insulating layers 603a and 603b are provided over the word line 602. The first insulating layers 603a and 603b are formed by using the same material, in which an opening (a contact hole) that reaches the word line 602 is provided. A word line electrode 604 is provided so as to cover the opening. In addition, the word line electrode 604, which is electrically connected to the word line 602 through the opening, is provided over the first insulating layers 603a and 603b. The word line electrode 604 and a bit line 601 are provided in the same layer, that is, over the first insulating layer 603a.

The memory element shown in FIGS. 6A and 6B has a structure in which a layer 605 containing an organic compound has a cross-sectional shape that is different from that of the layer 105 containing an organic compound shown in FIG. 1A. FIG. 1A shows an example in which the layer 105 containing an organic compound is in contact with only the side surface of the word line electrode 104; however, in FIG. 6A, the layer 605 containing an organic compound is in contact with both of the side surface and a part of the top surface of the word line electrode 604. In addition, the layer 605 containing an organic compound fills in the opening.

A material which can be easily hardened is desirably used for the layer 605 containing an organic compound. By using the material which can be easily hardened, the second insulating layers 106a and 106b shown in FIG. 1B are not required to be provided. Further, by using the material which can be easily hardened, the bit line 601 and the word line electrode 604 can be made to be thinner than that of the bit line 101 and the word line 104 shown in FIG. 1A.

In addition, in the memory element shown in FIG. 6A, a protective layer may also be provided to cover the bit line 601, the word line electrode 604, the first insulating layers 603a and 603b, and the layer 605 containing an organic compound.

FIG. 6A also shows an example in which the bit line 601 is provided above the word line 602; however, the formation order is not particularly limited, and the word line may be provided above the bit line.

This embodiment mode can be arbitrarily combined with Embodiment Mode 1, 2, 3 or 4.

Embodiment Mode 6

Figure 7A:
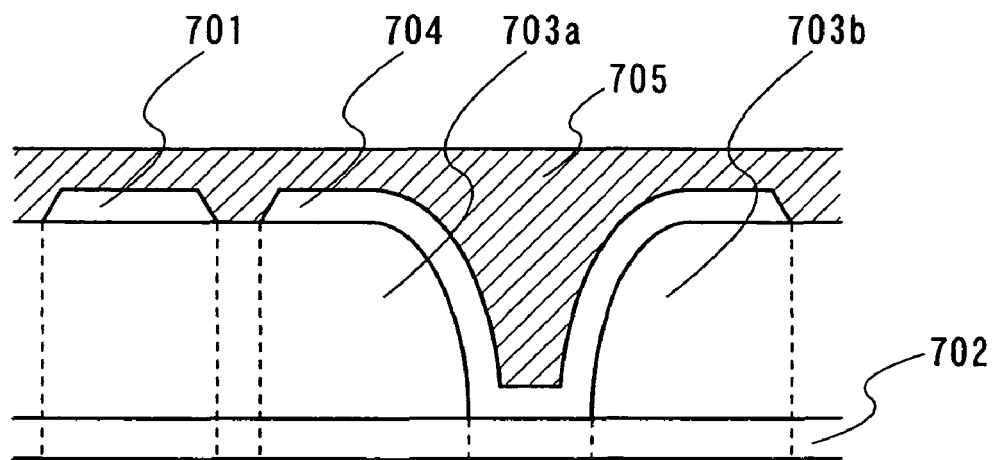
FIG. 7A is a cross-sectional view and FIG. 7B is a top view of a semiconductor device according to the present invention (Embodiment Mode 6)
Figure 7B:
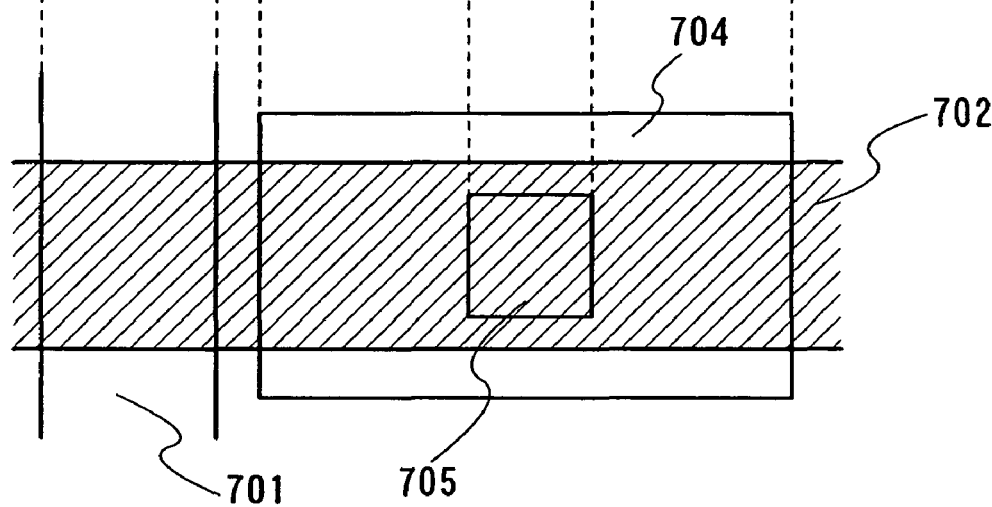

In this embodiment mode, FIGS. 7A and 7B show an example of a memory element which is partially different from the memory element shown in FIGS. 4A and 4B. FIG. 7A is a cross-sectional view of the memory element, and FIG. 7B is a top view corresponding to FIG. 7A.

The memory element shown in FIGS. 7A and 7B show an example in which the word line is provided above the bit line.

In FIG. 7A, a bit line 702 is provided over a substrate having an insulated surface, and first insulating layers 703a and 703b are provided over the bit line 702. The first insulating layers 703a and 703b are formed by using the same material, in which an opening (a contact hole) that reaches the bit line 702 is provided. A bit line electrode 704 is provided so as to cover the opening. In addition, the bit line electrode 704, which is electrically connected to the bit line 702 through the opening, is provided over the first insulating layers 703a and 703b. The bit line electrode 704 and a word line 701 are provided in the same layer, that is, over the first insulating layer 703a.

Further, as shown in FIG. 7B, a layer 705 containing an organic compound is formed in a band-shape (also referred to as a line-shape). In addition, a second insulating layer may also be formed to fix the layer 705 containing an organic compound. In such a case, the second insulating layer is also formed in a band-shape (also referred to as a line-shape) parallel to the layer 705 containing an organic compound.

FIG. 7B shows an example in which the width of the layer 705 containing an organic compound is narrower than that of the word line electrode 704; however, it is not particularly limited, and the width of the layer 705 containing an organic compound may also be wider than that of the word line electrode 704.

The memory element shown in FIGS. 7A and 7B has a structure in which the width of the layer 705 containing an organic compound can be made wide, and thus, an allowable range of misalignment in forming the layer 705 containing an organic compound can be made wide.

In addition, in the memory element shown in FIG. 7A, a protective layer may also be provided to cover the word line 701, the bit line electrode 704, the first insulating layers 703a and 703b, and the layer 705 containing an organic compound.

This embodiment mode can be arbitrarily combined with Embodiment Mode 1, 2, 3, 4 or 5.

Embodiment Mode 7

Figure 8A:
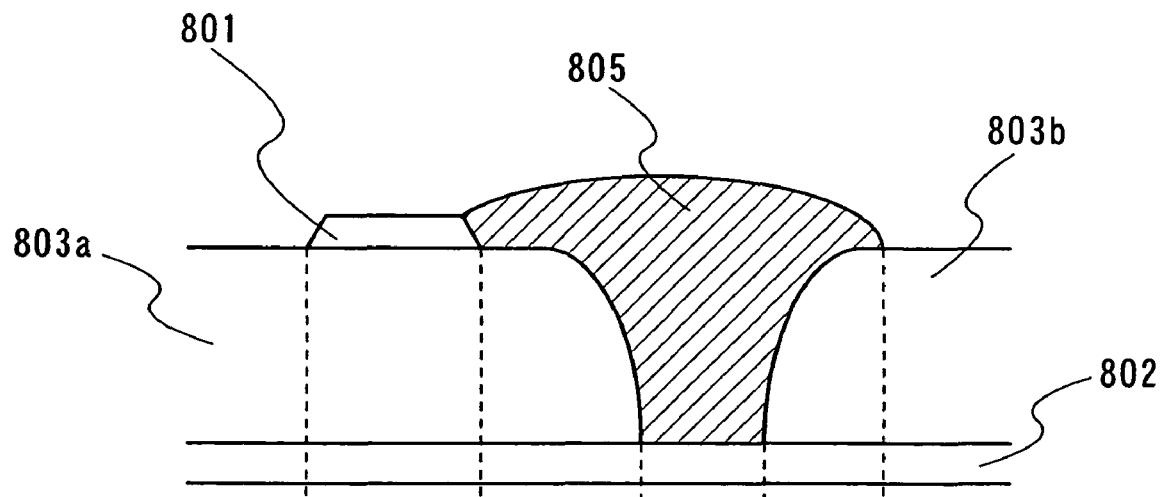
FIG. 8A is a cross-sectional view and FIG. 8B is a top view of a semiconductor device according to the present invention (Embodiment Mode 7)
Figure 8B:
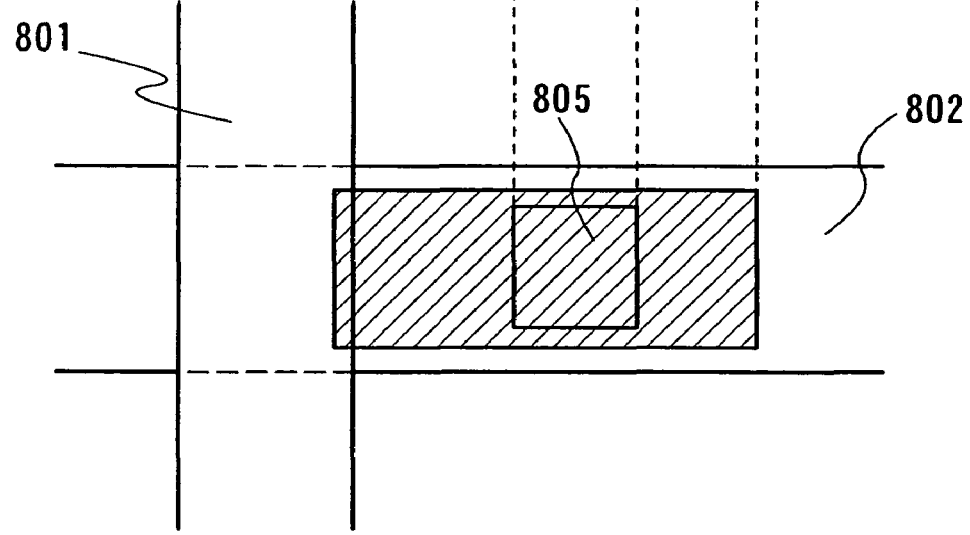

In this embodiment mode, FIGS. 8A and 8B show an example of a memory element which is partially different from the memory element shown in FIGS. 3A and 3B. FIG. 8A is a cross-sectional view of the memory element, and FIG. 8B is a top view corresponding to FIG. 8A.

In FIG. 8A, similarly to FIG. 3A, a word line 802 is provided over a substrate having an insulated surface, and first insulating layers 803a and 803b are provided over the word line 802. The first insulating layers 803a and 803b are formed by using the same material, in which an opening (a contact hole) that reaches the word line 802 is provided. A bit line 801 is provided over the first insulating layer 803a.

In FIG. 8A, a layer 805 containing an organic compound is provided to cover the opening that reaches the word line 802 and the side surface of the bit line 801, which is close to the opening. In FIG. 8A, the second insulating layer 306 shown in FIG. 3A is not provided. Therefore, further simplification of an element structure can be achieved, and the number of manufacturing steps can be reduced.

It is to be noted that an area of the opening surrounded by the first insulating layers 803a and 803b (the area taken along a horizontal plane to the substrate surface) decreases from the opening upper end portion side to the opening bottom surface side.

A distance between the bit line 801 and the opening bottom surface is desirably 0.1 to 0.05 μm, preferably 0.01 μm or less in a length that is horizontal to the substrate surface. When voltage is applied between the bit line 801 and the word line 802, current flows along the curved surface of the side wall of the first insulating layer 803a through the layer 805 containing an organic compound.

In addition, in the memory element shown in FIG. 8A, a protective layer may also be provided to cover the bit line 801, the first insulating layers 803a and 803b, and the layer 805 containing an organic compound.

FIG. 8A also shows an example in which the bit line 801 is provided above the word line 802; however, the formation order is not particularly limited, and the word line may be provided above the bit line.

This embodiment mode can be arbitrarily combined with Embodiment Mode 1, 2, 3, 4, 5, or 6.

Embodiment Mode 8

Figure 9A:
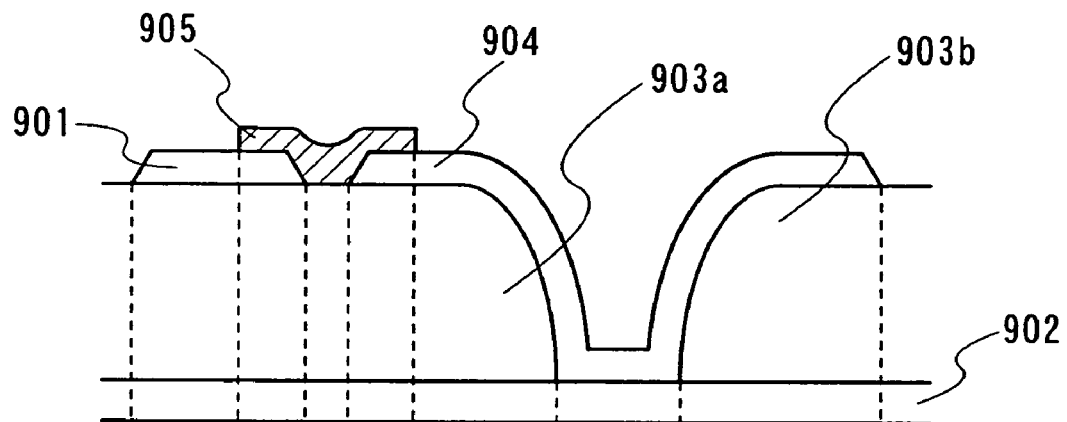
FIG. 9A is a cross-sectional view and FIG. 9B is a top view of a semiconductor device according to the present invention (Embodiment Mode 8)
Figure 9B:
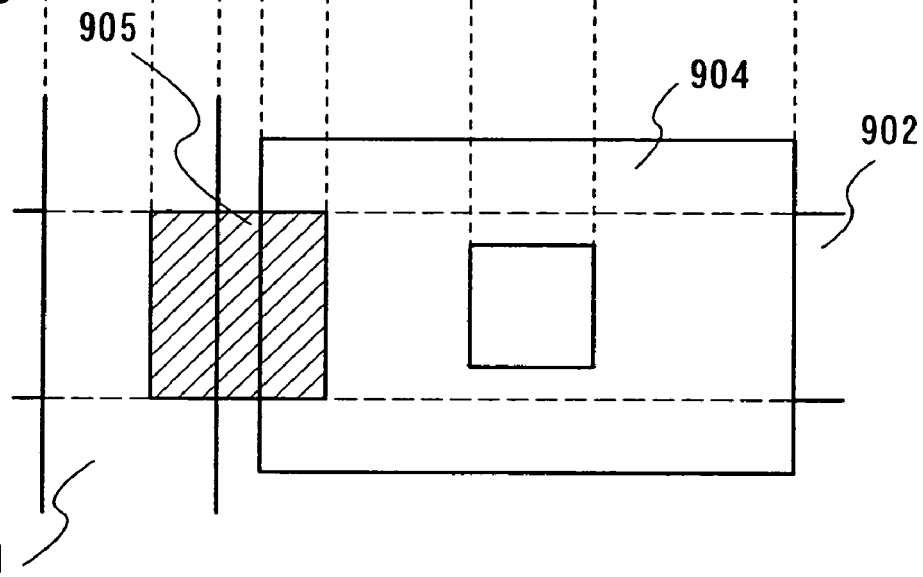

In this embodiment mode, FIGS. 9A and 9B show an example of a memory element which is partially different from the memory element shown in FIGS. 5A and 5B. FIG. 9A is a cross-sectional view of the memory element, and FIG. 9B is a top view corresponding to FIG. 9A.

In FIG. 9A, similarly to FIG. 5A, a word line 902 is provided over a substrate having an insulated surface, and first insulating layers 903a and 903b are provided over the word line 902. The first insulating layers 903a and 903b are formed by using the same material, in which an opening that reaches the word line 902 is provided. A word line electrode 904 is provided so as to cover the opening. In addition, the word line electrode 904, which is electrically connected to the word line 902 through the opening, is provided over the first insulating layers 903a and 903b. The word line electrode 904 and a bit line 901 are provided in the same layer, that is, over the first insulating layer 903a.

The memory element shown in FIGS. 9A and 9B has a structure in which a layer 905 containing an organic compound has a cross-sectional shape that is different from the layer 505 containing an organic compound shown in FIG. 5A. In FIG. 9A, the surface of the layer 905 containing an organic compound has a shape in accordance with concavity and convexity of a lower portion.

In addition, in the memory element shown in FIG. 9A, a protective layer may also be provided to cover the bit line 901, the word line electrode 904, the first insulating layers 903a and 903b, and the layer 905 containing an organic compound.

FIG. 9A also shows an example in which the bit line 901 is provided above the word line 902; however, the formation order is not particularly limited, and the word line may be provided above the bit line.

This embodiment mode can be arbitrarily combined with Embodiment Mode 1, 2, 3, 4, 5, 6 or 7.

Embodiment Mode 9

Figure 10A:
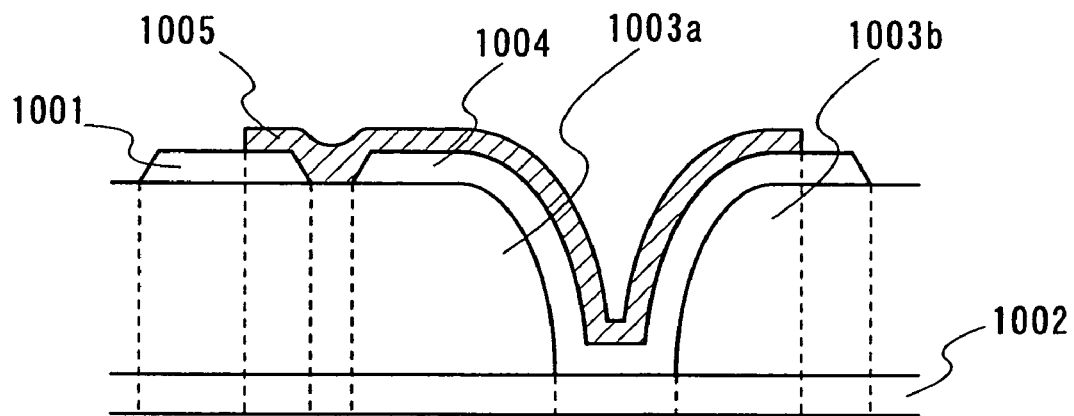
FIG. 10A is a cross-sectional view and FIG. 10B is a top view of a semiconductor device according to the present invention (Embodiment Mode 9)
Figure 10B:
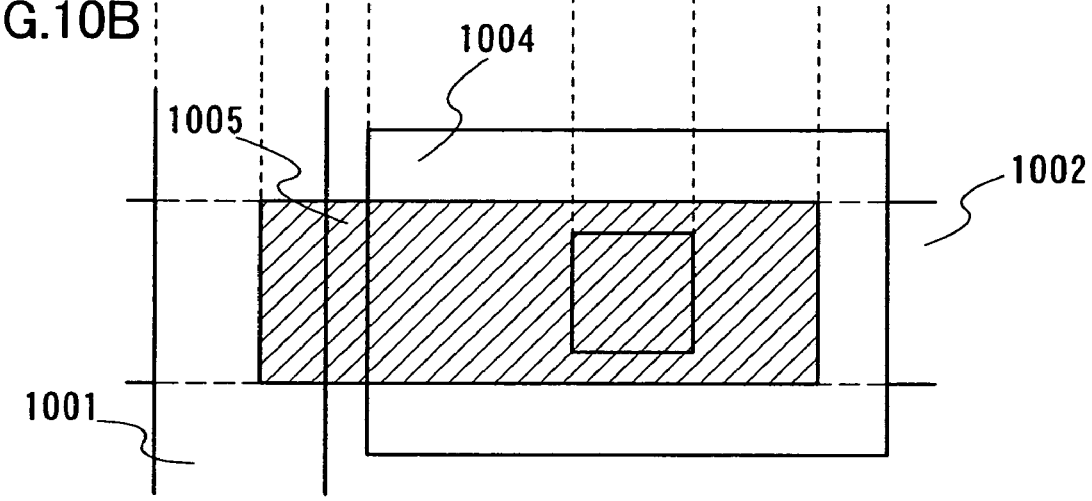

In this embodiment mode, FIGS. 10A and 10B show an example of a memory element which is partially different from the memory element shown in FIGS. 6A and 6B. FIG. 10A is a cross-sectional view of the memory element, and FIG. 10B is a top view corresponding to FIG. 10A.

In FIG. 10A, similarly to FIG. 6A, a word line 1002 is provided over a substrate having an insulated surface, and first insulating layers 1003a and 1003b are provided over the word line 1002. The first insulating layers 1003a and 1003b are formed by using the same material, in which an opening (a contact hole) that reaches the word line 1002 is provided. A word line electrode 1004 is provided so as to cover the opening. In addition, the word line electrode 1004, which is electrically connected to the word line 1002 through the opening, is provided over the first insulating layers 1003a and 1003b. The word line electrode 1004 and a bit line 1001 are provided in the same layer, that is, over the first insulating layer 1003a.

The memory element shown in FIGS. 10A and 10B has a structure in which a layer 1005 containing an organic compound has a cross-sectional shape that is different from the layer 605 containing an organic compound shown in FIG. 6A. In FIG. 6A, the layer 605 containing an organic compound fills in the opening. On the other hand, in FIG. 10A, the surface of the layer 1005 containing an organic compound has a shape in accordance with concavity and convexity of a lower portion.

In addition, in the memory element shown in FIG. 10A, a protective layer may also be provided to cover the bit line 1001, the word line electrode 1004, the first insulating layers 1003a and 1003b, and the layer 1005 containing an organic compound.

FIG. 10A also shows an example in which the bit line 1001 is provided above the word line 1002; however, the formation order is not particularly limited, and the word line may be provided above the bit line.

This embodiment mode can be arbitrarily combined with Embodiment Mode 1, 2, 3, 4, 5, 6, 7 or 8.

Embodiment Mode 10

Figure 11A:
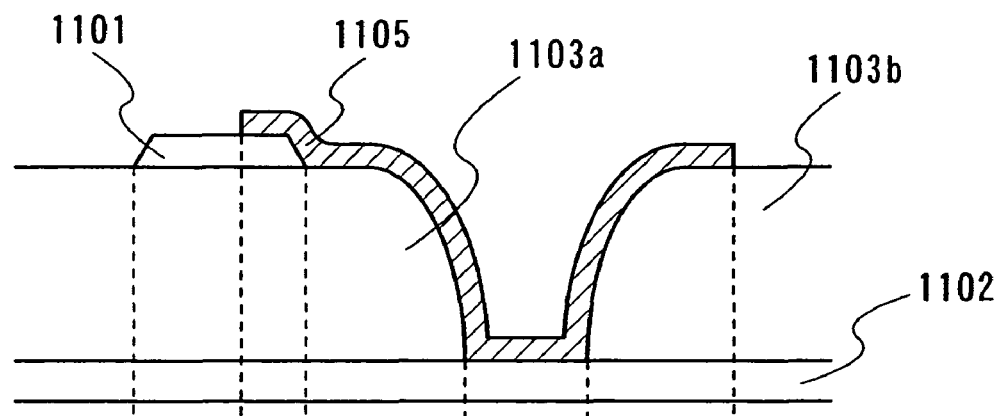
FIG. 11A is a cross-sectional view and FIG. 11B is a top view of a semiconductor device according to the present invention (Embodiment Mode 10)
Figure 11B:
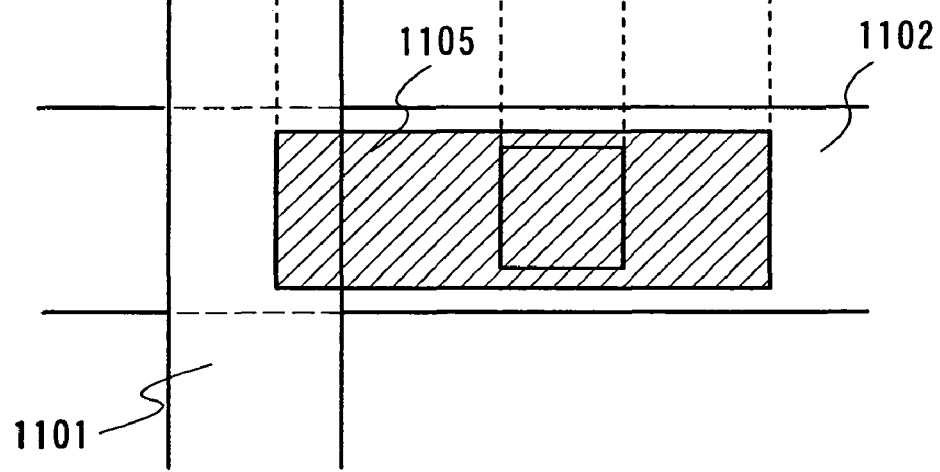

In this embodiment mode, FIGS. 11A and 11B show an example of a memory element which is partially different from the memory element shown in FIGS. 8A and 8B. FIG. 11A is a cross-sectional view of the memory element, and FIG. 11B is a top view corresponding to FIG. 11A.

In FIG. 11A, similarly to FIG. 8A, a word line 1102 is provided over a substrate having an insulated surface, and first insulating layers 1103a and 1103b are provided over the word line 1102. The first insulating layers 1103a and 1103b are formed by using the same material, in which an opening (a contact hole) that reaches the word line 1102 is provided. A bit line 1101 is provided over the first insulating layer 1103a.

In FIG. 11A, similarly to FIG. 8A, a layer 1105 containing an organic compound is provided to cover the opening that reaches the word line 1102 and the side surface of the bit line 1101, which is close to the opening. In FIG. 11A, the second insulating layer is not provided, similarly to FIG. 8A. Therefore, further simplification of an element structure can be achieved, and the number of manufacturing steps can be reduced.

The memory element shown in FIGS. 11A and 11B has a structure in which the layer 1105 containing an organic compound has a cross-sectional shape that is different from the layer 805 containing an organic compound shown in FIG. 8A. In FIG. 8A, the layer 805 containing an organic compound fills in the opening. On the other hand, in FIG. 11A, the surface of the layer 1105 containing an organic compound has a shape in accordance with concavity and convexity of a lower portion.

In addition, in the memory element shown in FIG. 1A, a protective layer may also be provided to cover the bit line 1101, the first insulating layers 1103a and 1103b, and the layer 1105 containing an organic compound.

FIG. 11A also shows an example in which the bit line 1101 is provided above the word line 1102; however, the formation order is not particularly limited, and the word line may be provided above the bit line.

This embodiment mode can be arbitrarily combined with Embodiment Mode 1, 2, 3, 4, 5, 6, 7, 8 or 9.

Embodiment Mode 11

Figure 12A:
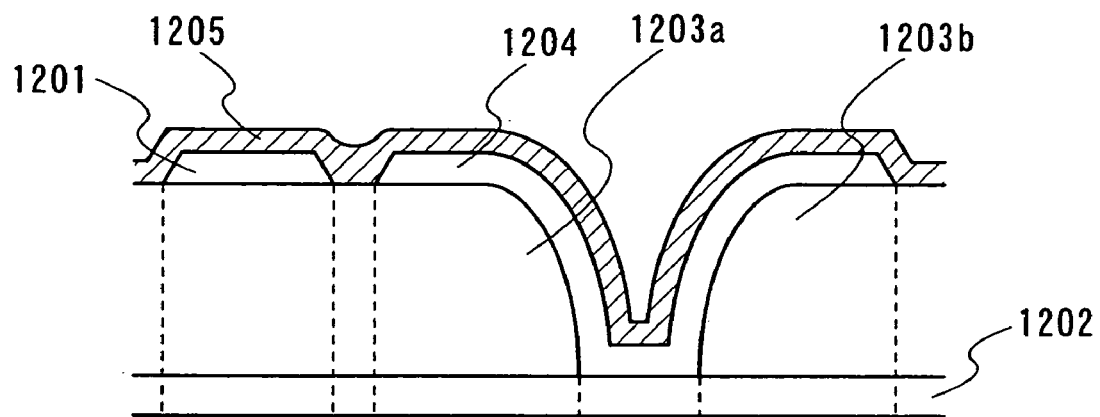
FIG. 12A is a cross-sectional view and FIG. 12B is a top view of a semiconductor device according to the present invention (Embodiment Mode 11)
Figure 12B:
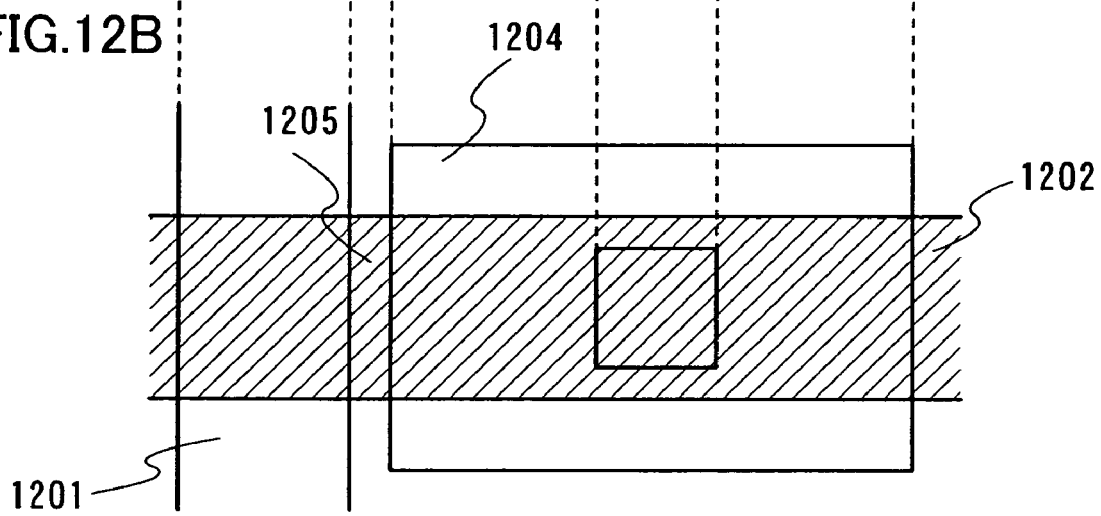

In this embodiment mode, FIGS. 12A and 12B show an example of a memory element which is partially different from the memory element shown in FIGS. 4A and 4B. FIG. 12A is a cross-sectional view of the memory element, and FIG. 12B is a top view corresponding to FIG. 12A.

In FIG. 12A, similarly to FIG. 4A, a word line 1202 is provided over a substrate having an insulated surface, and first insulating layers 1203a and 1203b are provided over the word line 1202. The first insulating layers 1203a and 1203b are formed by using the same material, in which an opening (a contact hole) that reaches the word line 1202 is provided. A word line electrode 1204 is provided so as to cover the opening. In addition, the word line electrode 1204, which is electrically connected to the word line 1202 through the opening, is provided over the first insulating layers 1203a and 1203b. The word line electrode 1204 and a bit line 1201 are provided in the same layer, that is, over the first insulating layer 1203a.

In the memory element shown in FIG. 12A, a layer 1205 containing an organic compound covers both side surfaces of the word line electrode 1204 and both side surfaces of the bit line 1201.

Further, as shown in FIG. 12B, the layer 1205 containing an organic compound is formed in a band-shape. In addition, a second insulating layer may also be formed to fix the layer 1205 containing an organic compound. In such a case, the second insulating layer is also formed in a band-shape (also referred to as a line-shape) parallel to the layer 1205 containing an organic compound.

The memory element shown in FIGS. 12A and 12B has a structure in which the layer 1205 containing an organic compound has a cross-sectional shape that is different from that of the layer 405 containing an organic compound shown in FIG. 4A. In FIG. 4A, the layer 405 containing an organic compound fills in the opening. On the other hand, in FIG. 12A, the surface of the layer 1205 containing an organic compound has a shape in accordance with concavity and convexity of a lower portion.

In addition, in the memory element shown in FIG. 12A, a protective layer may also be provided to cover the bit line 1201, the word line electrode 1204, the first insulating layers 1203a and 1203b, and the layer 1205 containing an organic compound.

FIG. 12A also shows an example in which the bit line 1201 is provided above the word line 1202; however, the formation order is not particularly limited, and the word line may be provided above the bit line.

This embodiment mode can be arbitrarily combined with Embodiment Mode 1, 2, 3, 4, 5, 6, 7, 8, 9 or 10.

The present invention including the above structure will be explained more in detail with reference to embodiments that will be shown below.

[Embodiment 1]

This embodiment will explain a structure of a memory device in which a plurality of the memory elements formed in any one of Embodiment Modes 1 to 11 is arranged and a method of writing data.

Figure 13A:
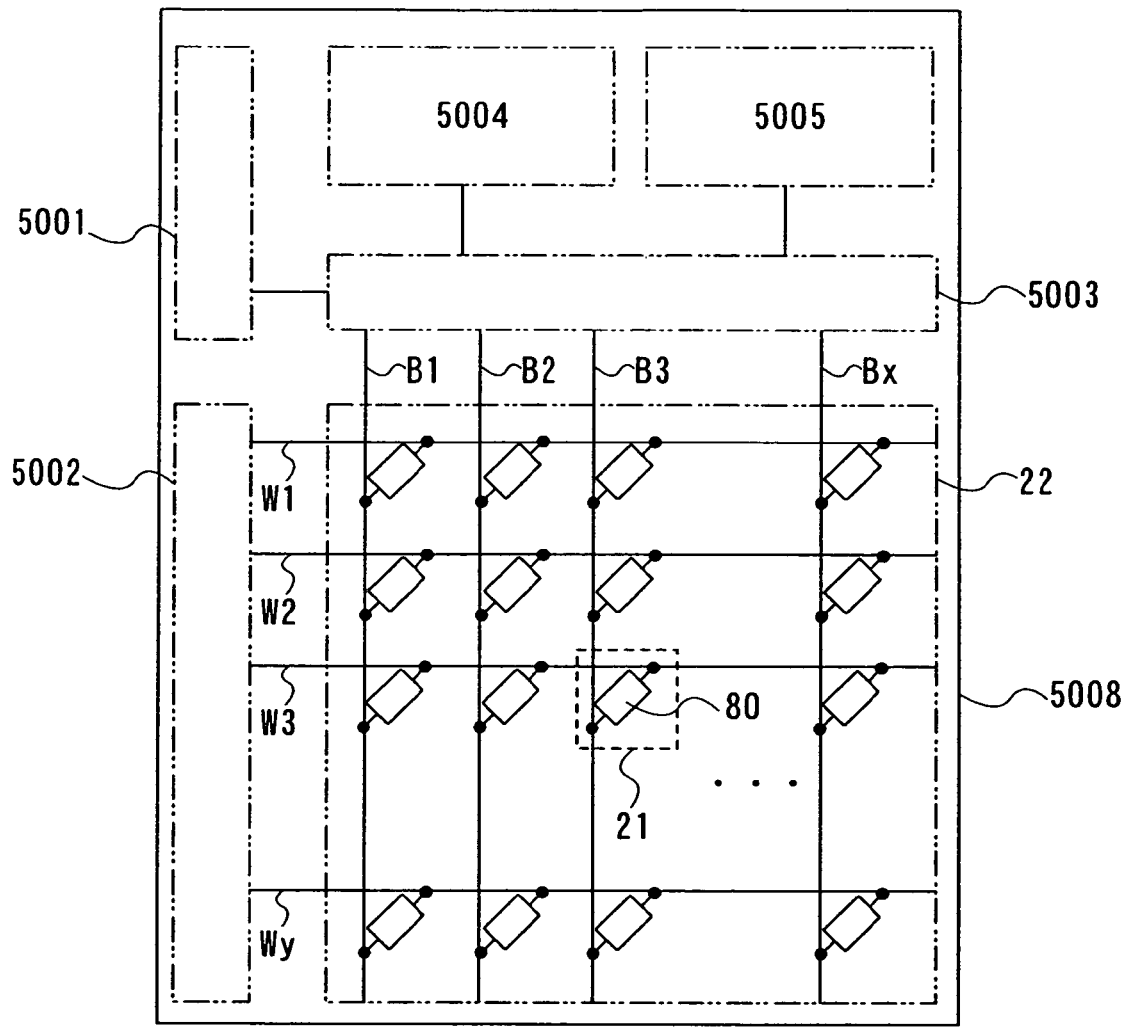
FIGS. 13A and 13B are diagrams each explaining a writing circuit included in a memory device according to the present invention (Embodiment 1)

In FIG. 13A, a word line is Wn ($1 \leq n \leq y$), and a bit line is Bm ($1 \leq m \leq x$).

FIG. 13A shows a structure of a memory device according to the present invention. A memory device 5008 according to the present invention includes a column decoder 5001, a row decoder 5002, a reading circuit 5004, a writing circuit 5005, a selector 5003, and a memory cell array 22. The memory cell array 22 includes a plurality of memory cells 21.

Each of the memory cells 21 includes a memory element 80.

In the present invention, as shown in Embodiment Mode 1, a bit line (a first conductive layer) and a word line electrode (a second conductive layer) connected to a word line are formed over the same plane. The memory element 80 includes the word line electrode, the bit line, and a layer containing an organic compound between the word line electrode and the bit line.

It is to be noted that the structure of the memory device 5008 shown here is just one example, and other circuits such as a sense amplifier, an output circuit, and a buffer may be included, or a writing circuit may be provided in a bit line driver circuit.

The column decoder 5001 receives an address signal to specify a column of the memory cell array, and gives a signal to the selector 5003 of the specified column. The selector 5003 receives the signal of the column decoder 5001, and selects a bit line of the specified column. The row decoder 5002 receives an address signal to specify a row of the memory cell array, and selects a word line of the specified row. In accordance with the operation described above, one memory cell 21 corresponding to the address signal is selected. The reading circuit 5004 reads data of the selected memory cell, and amplifies and outputs the data. The writing circuit 5005 generates voltage necessary for writing, and applies the voltage to a memory element of the selected memory cell to perform writing of data.

Figure 13B:
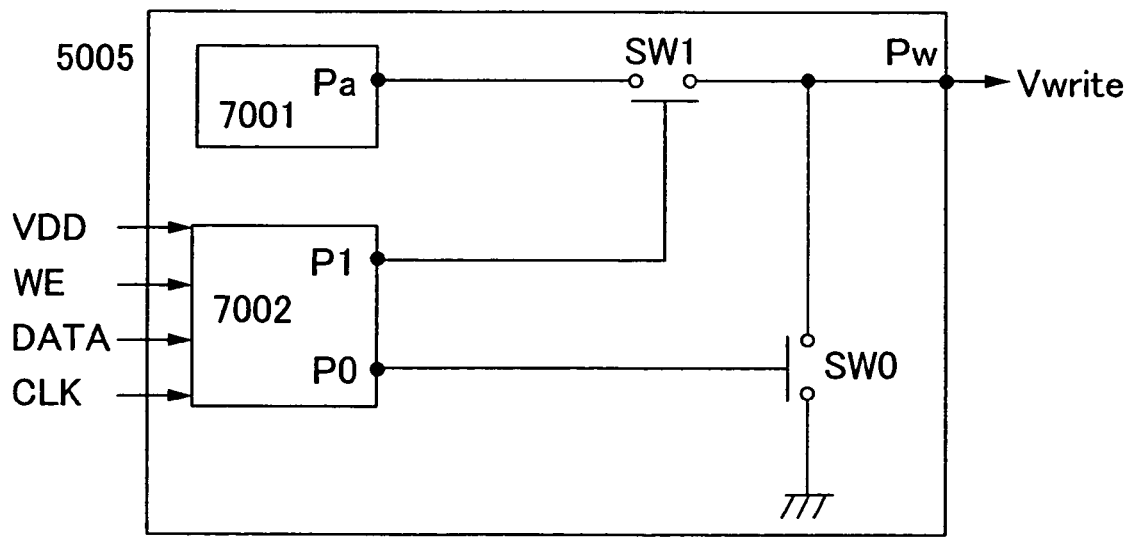

FIG. 13B shows a structure of the writing circuit 5005 of the memory device according to the present invention. The writing circuit 5005 includes a voltage generating circuit 7001, a timing control circuit 7002, switches SW0 and SW1, and an output terminal Pw. The voltage generating circuit 7001 is formed by a boosting circuit or the like and generates voltage V1 necessary for writing, which is outputted from an output terminal Pa. The timing control circuit 7002 generates signals S0 and S1 controlling the switches SW0 and SW1, respectively, from a writing control signal (referred to as WE), a data signal (referred to as DATA), a clock signal (referred to as CLK), and the like, and outputs the signals from output terminals P0 and P1, respectively. The switch SW0 controls a connection with the ground, and the SW1 controls a connection with the output terminal Pa of the voltage generating circuit 7001. Output voltage Vw from the output terminal Pw of the writing circuit can be switched by these switches.

Next, a writing operation is explained, where an initial state in which conductivity of the memory element is not changed is referred to as "0" and a short-circuit state in which conductivity of the memory element is changed is referred to as "1". First, an input signal WE turns to Hi, the column decoder 5001 which has received an address signal to specify a column gives a signal to the selector 5003 of the specified column, and the selector 5003 connects the bit line of the specified column to the output terminal Pw of the writing circuit. The bit line which is not specified is in a non-connection (referred to as floating) state, and output voltage Vw of the writing circuit becomes V1. Similarly, the row decoder 5002, which has received an address signal to specify a row, applies voltage V2 to the word line of the specified row and 0V to the word line which is not specified. In accordance with the above-described operation, one memory element 80 corresponding to the address signal is selected. At this time, 0V is applied to the word line electrode.

At the same time, by receiving an input signal DATA=Hi, the voltage generating circuit 7001 can generate voltage V1 and output the voltage from the output terminal Pa. The timing control circuit 7002 can generate signals S0 and S1 controlling the switches SW0 and SW1, respectively, from input signals WE, DATA, CLK, power supply potantial (VDD), and the like, and output the signals from the output terminals P0 and P1, respectively. By the above signals, the switches SW0 and SW1 are switched, and the writing circuit 5001 can output voltage V1 as the output voltage Vw from the output terminal Pw.

In the selected memory element, by the operation as described above, the voltage V2 is applied to the word line, the voltage V1 is applied to the bit line, and 0V is applied to the word line electrode. Then, the layer containing an organic compound is conducted, and the voltage V1 of the bit line is applied to the bit line (the first conductive layer) of the memory element. As a result, conductivity of the memory element is changed to be in a short-circuit state, and "1" is written.

When the input signal WE turns to Lo (low voltage which disables writing), all the word lines have 0V, and all the bit lines (the first conductive layers) and the word line electrodes (the second conductive layers) are in a floating state. At this time, the timing control circuit generates Lo as signals S0 and S1, which are outputted from the output terminals P0 and P1. The output terminal Pw is in a floating state. In accordance with the operation as described above, writing is not performed.

Subsequently, writing of "0" is explained. When writing of "0" is performed, conductivity of the memory element is not changed, and voltage is not applied to the memory element. In other words, writing of "0" can be achieved by keeping an initial state. First, when the input signal WE turns to Hi (high voltage which enables writing) at the same time as writing of "1", the column decoder 5001 which has received an address signal to specify a column gives a signal to the selector 5003 of the specified column, and the selector 5003 connects the bit line of the specified column to the output terminal Pw of the writing circuit. At this time, the bit line which is not specified is in a floating state. Similarly, the row decoder 5002 which has received an address signal to specify a row applies the voltage V2 to the word line of the specified row and 0V to the word line which is not specified. By the operation as described above, one memory element 80 corresponding to the address signal is selected. At this time, 0V is applied to the word line electrode.

At the same time, by receiving an input signal DATA=Lo, the timing control circuit 70002 generates control signals S0=Hi and S1=Lo, and outputs the control signals from the output terminals P0 and P1, respectively. By the control signals, the switch SW0 is turned on and the switch SW1 is turned off, and 0V is outputted as the output voltage Vw from the output terminal Pw.

In the selected memory element, by the operation as described above, V2 is applied to the word line, and 0V is applied to the bit line and the word line electrode. Therefore, voltage is not applied to the memory element, and conductivity is not changed, and thus, an initial state "0" is kept.

When the input signal WE turns to Lo, all the word lines have 0V, and all the bit lines and the word line electrodes are in a floating state. At the same time, the timing control circuit generates Lo as signals S0 and S1, which are outputted from the output terminals P0 and P1, respectively, and the output terminal Pw is in a floating state.

In such a manner, writing of "1" or "0" can be performed.

Then, reading of data is explained.

Figure 14:
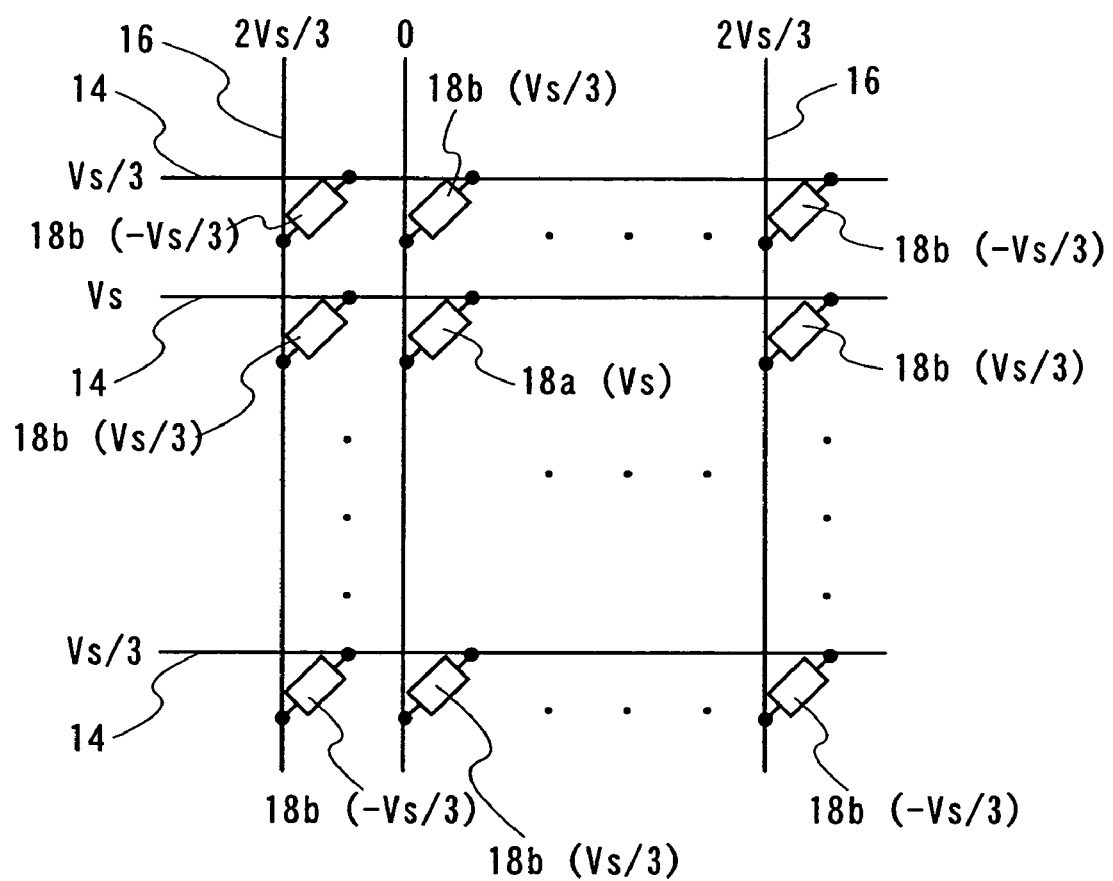
FIG. 14 is a diagram explaining a reading circuit included in a memory device according to the present invention (Embodiment 1)

In FIG. 14, reference numeral 14 indicates a word line and 16 indicates a bit line.

FIG. 14 shows one selected cell 18a and other non-selected cells 18b. The word line 14 connected to the selected cell 18a arranged in an address (2, 2) is set at potential Vs (word selecting potential) and the bit line 16 is set at potential 0 (bit selecting potential). Therefore, a plus electric field of Vs−0=Vs is applied to the selected cell 18a. Accordingly, when current of the bit line 16 connected to the selected cell 18a is detected by the lead operation as described above, a state of the memory can be determined to be "1" or "0" as described above.

In addition, an actual reading operation is carried out to a plurality of memory cells of one word line 14 at the same time, and a group of data of 8-bit or 16-bit is read out at the same time.

This embodiment can be arbitrarily combined with Embodiment Mode 1, 2, 3, 4, 5, 6, 7, 8, 9, 10 or 11.

[Embodiment 2]

Figure 15:
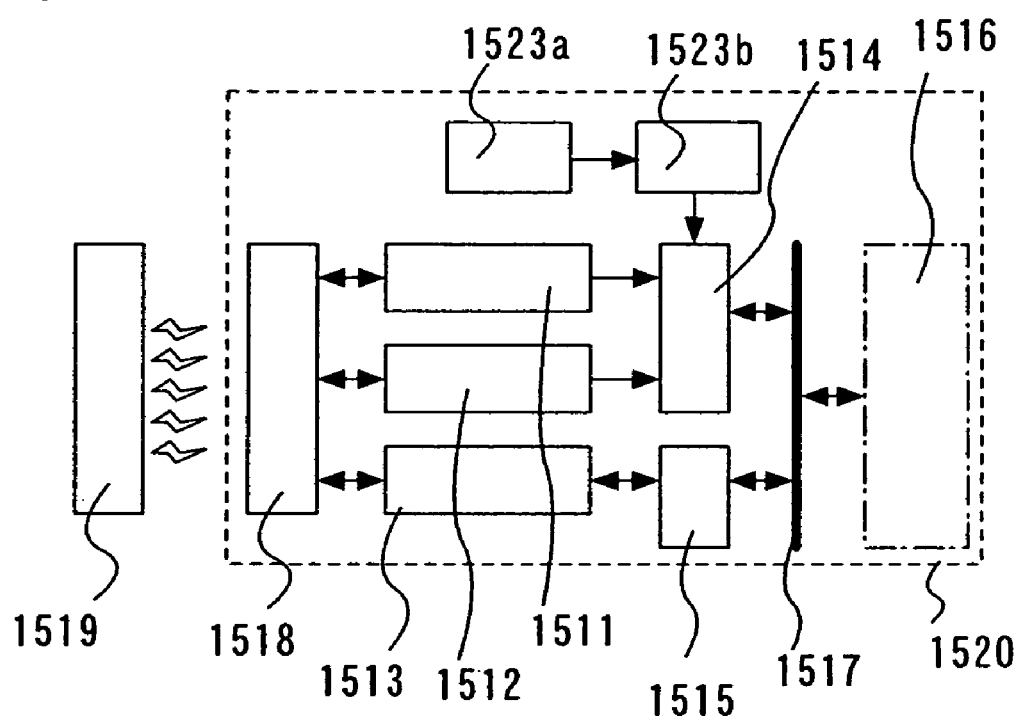
FIG. 15 is a diagram explaining a structure example of a semiconductor device according to the present invention (Embodiment 2)

A structure of a semiconductor device of this embodiment will be explained with reference to FIG. 15. As shown in FIG. 15, a semiconductor device 1520 according to the present invention has a function of non-contact communication of data, and includes a power supply circuit 1511, a clock generating circuit 1512, a data demodulation/modulation circuit 1513, a control circuit 1514 for controlling other circuits, an interface circuit 1515, a memory circuit 1516, a data bus 1517, an antenna (antenna coil) 1518, a sensor 1523a, and a sensor circuit 1523b.

The power supply circuit 1511 generates various kinds of voltage or current to be supplied to each circuit inside the semiconductor device 1520 based on an AC signal inputted from the antenna 1518. The clock generating circuit 1512 generates various kinds of clock signals to be supplied to each circuit inside the semiconductor device 1520 based on an AC signal inputted from the antenna 1518. The data demodulation/modulation circuit 1513 has a function of demodulating/modulating data communicated with a reader/writer 1519. The control circuit 1514 has a function of controlling the memory circuit 1516. The antenna 1518 has a function of transmitting/receiving electromagnetic field or a radio wave. The reader/writer 1519 communicates with and controls the semiconductor device, and controls processing of the data thereof. It is to be noted that the structure of the semiconductor device is not limited to the above structure, and for example, other elements such as a limiter circuit of power supply voltage and hardware dedicated to encryption processing may be additionally provided.

The memory circuit 1516 includes a memory element in which an insulating layer which is changed by electric action from the outside or light irradiation is interposed between a pair of conductive layers. It is to be noted that the memory circuit 1516 may include only the memory element in which an insulating layer is interposed between a pair of conductive layers, or may include another memory circuit having a different structure. The memory circuit having a different structure corresponds to, for example, one or more circuits of a DRAM, an SRAM, an FeRAM, a mask ROM, a PROM, an EPROM, an EEPROM, and a flash memory.

The sensor 1523a is formed by a semiconductor element such as a resistive element, a capacitive coupling element, an inductive coupling element, a photovoltaic element, a photoelectric conversion element, a thermal electromotive force element, a transistor, a thermistor, or a diode. The sensor circuit 1523b detects a change in impedance, reactance, inductance, voltage, or current, and performs analog/digital conversion (A/D conversion) to output a signal to the control circuit 1514.

This embodiment can be arbitrarily combined with Embodiment Mode 1, 2, 3, 4, 5, 6, 7, 8, 9, 10 or 11, or Embodiment 1.

[Embodiment 3]

Figure 16A:
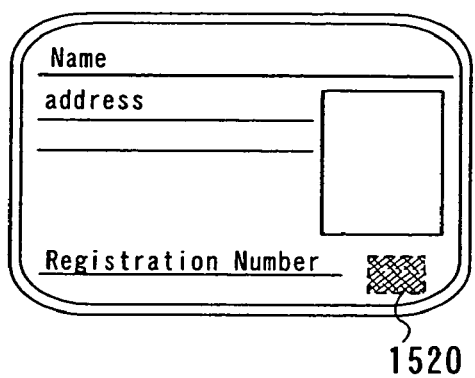
FIGS. 16A to 16F are views each explaining a usage mode of a semiconductor device according to the present invention (Embodiment 3)
Figure 16B:
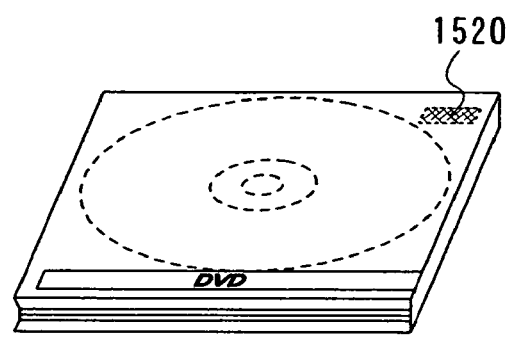
Figure 16C:
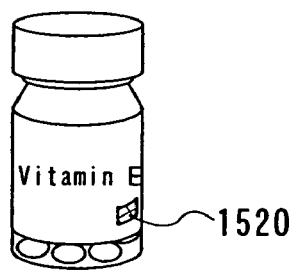
Figure 16D:
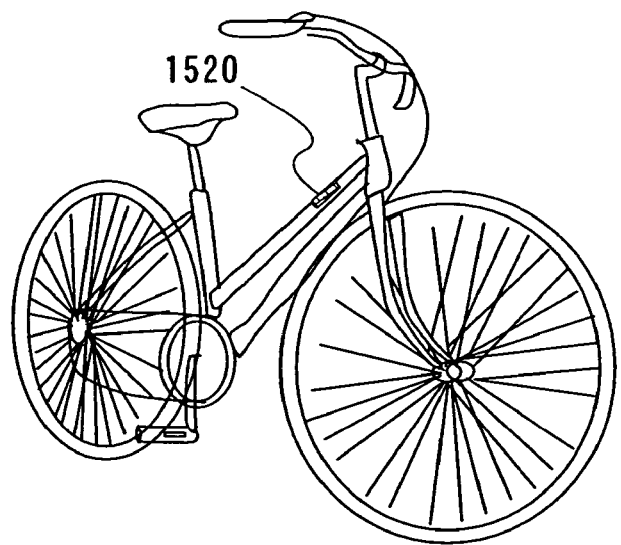
Figure 16E:
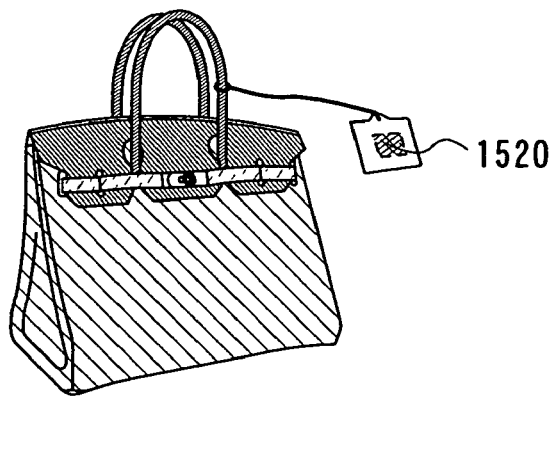
Figure 16F:
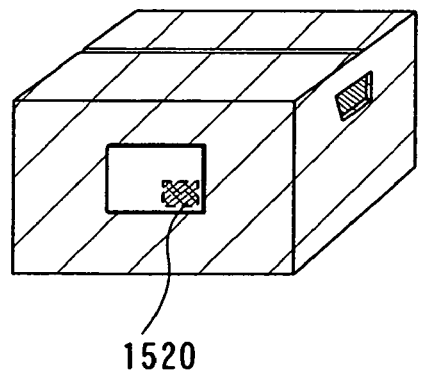

In accordance with the present invention, a semiconductor device functioning as a wireless chip can be formed. A wireless chip can be used broadly, and may be used by being mounted in objects such as bills, coins, securities, bearer bonds, certificates (driver's licenses, resident cards, and the like, refer to FIG. 16A), containers for wrapping objects (wrapping paper, bottles, and the like, refer to FIG. 16C), recording media (DVDs, video tapes, and the like, refer to FIG. 16B), vehicles (bicycles and the like, refer to FIG. 16D), personal belongings (bags, glasses, and the like), foods, plants, animals, human bodies, clothes, livingware, and products such as electronic equipment, or shipping tags of baggage (refer to FIGS. 16E and 16F). The electronic equipment indicates a liquid crystal display device, an EL display device, a television unit (also simply referred to as a TV, a TV receiver, or a television receiver), a cellular phone, or the like.

A semiconductor device 1520 according to the present invention is mounted on a printed substrate, attached to a surface, or incorporated to be fixed in an object. For example, the semiconductor device is incorporated in paper of a book, or an organic resin of a package to be fixed in each object. As for the semiconductor device 1520 according to the present invention, downsizing, a thinner shape and lightweight are achieved, and an attractive design of the object itself is not damaged even after fixing the semiconductor device in the object. In addition, by providing the semiconductor device 1520 according to the present invention in bills, coins, securities, bearer bonds, certificates, and the like, a certification function can be obtained and forgery thereof can be prevented by making the use of the certification function. Further, by providing the semiconductor device 1520 according to the present invention in containers for wrapping objects, recording media, personal belongings, foods, clothes, livingware, electronic equipment, and the like, a system such as an inspection system can be more efficient.

Figure 17:
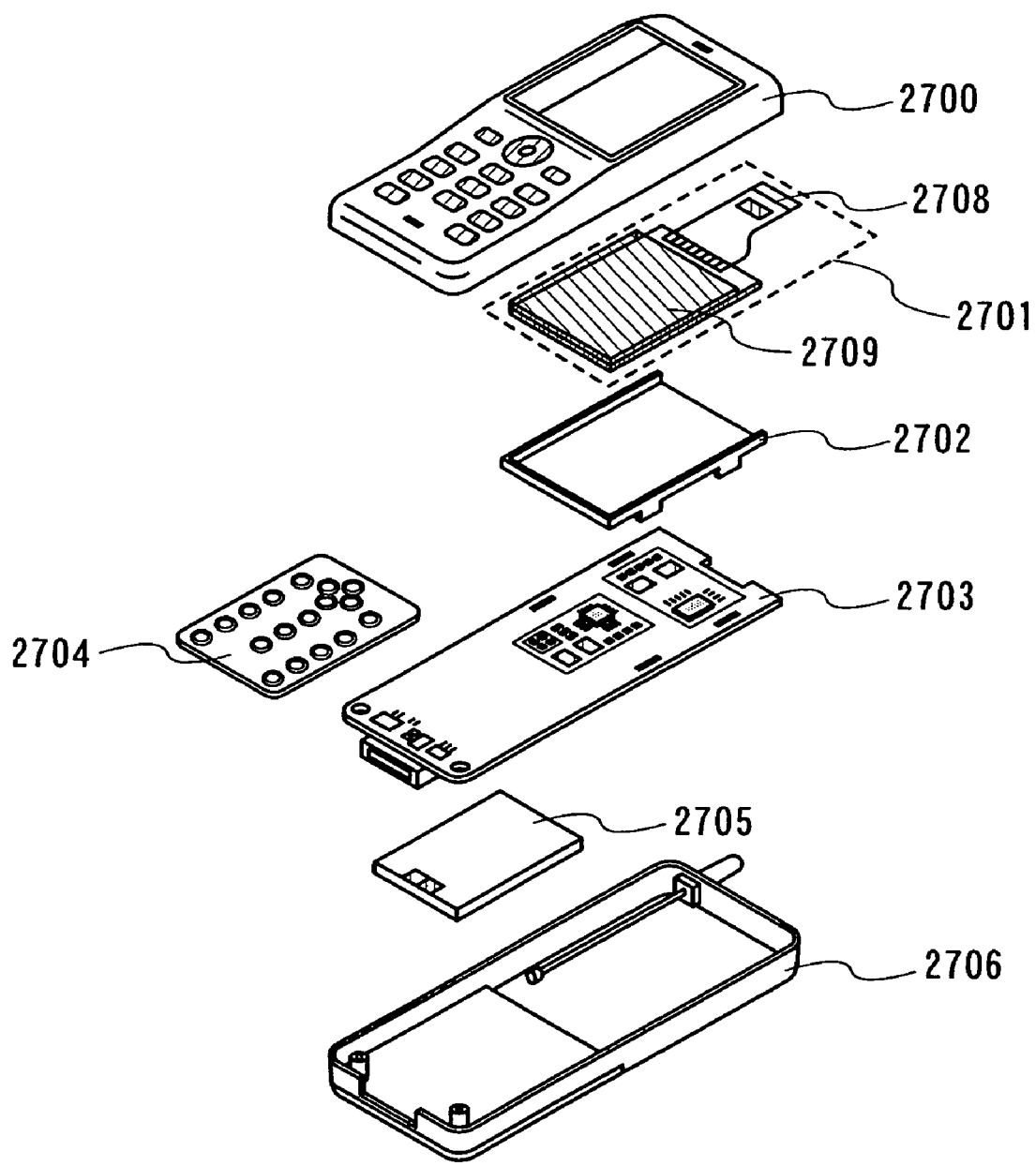
FIG. 17 is a view explaining electronic equipment having a semiconductor device according to the present invention (Embodiment 3).

Subsequently, an example of electronic equipment mounted with the semiconductor device according to the present invention is explained with reference to the drawing. The electronic equipment illustrated here is a cellular phone, which includes chassis 2700 and 2706, a panel 2701, a housing 2702, a printed wiring board 2703, operation buttons 2704, and a battery 2705 (refer to FIG. 17). The panel 2701 is incorporated in the housing 2702 to be detachable, and the housing 2702 is mounted on the printed wiring board 2703. As for the housing 2702, a shape and a size thereof are appropriately changed depending on electronic equipment in which the panel 2701 is incorporated. A plurality of semiconductor devices which are packaged is mounted on the printed wiring board 2703, and as one of the semiconductor devices, a semiconductor device according to the present invention can be used. Each of the plurality of semiconductor devices mounted on the printed wiring board 2703 has a function of a controller, a central processing unit (CPU), a memory, a power supply circuit, an audio processing circuit, a transmit/receive circuit, or the like.

The panel 2701 is connected to the printed wiring board 2703 through a connection film 2708. The panel 2701, the housing 2702, and the printed wiring board 2703 are stored in the chassis 2700 and 2706 with the operation buttons 2704 and the battery 2705. A pixel region 2709 included in the panel 2701 is arranged so as to be visually recognized from an aperture provided in the chassis 2700.

As described above, the semiconductor device according to the present invention has features of a small size, a thin shape, and lightweight. By these features, a limited space inside the chassis 2700 and 2706 of the electronic equipment can be used efficiently.

In addition, since the semiconductor device according to the present invention includes a memory element having a simple structure in which an organic layer which is changed by electric action from the outside is interposed between a pair of conductive layers, electronic equipment using an inexpensive semiconductor device can be provided. Further, since the semiconductor device according to the present invention can be easily highly integrated, electronic equipment using a semiconductor device having a large-capacity memory circuit can be provided.

In addition, the memory device included in the semiconductor device according to the present invention can perform writing of data by electric action from the outside, and has a feature that the memory device is nonvolatile and can perform additional writing of data. By this feature, forgery due to rewriting can be prevented, and new data can be additionally written. Therefore, electronic equipment using a semiconductor device in which higher function and higher added-value are achieved can be provided.

It is to be noted that the chassis 2700 and 2706 are shown as one example of an appearance shape of a cellular phone, and the electronic equipment relating to this embodiment can be changed to various modes in accordance with a function or an application thereof.

This embodiment can be arbitrarily combined with Embodiment Mode 1, 2, 3, 4, 5, 6, 7, 8, 9, 10 or 11, or Embodiment 1 or 2.

This application is based on Japanese Patent Application serial No. 2005-160352 field in Japan Patent Office on May 31, 2005, the entire contents of which are hereby incorporated by reference.

What is claimed is:

1. A memory device comprising:
a word line extending in a first direction,
a first insulating film over the word line,
a first opening reaching the word line in the first insulating film,
a bit line extending in a second direction that is extended across the first direction over the first insulating film,
a second insulating film over the bit line,
a second opening reaching the bit line in the second insulating film, and
a layer containing an organic compound over one side surface of the bit line and the first and second openings,
wherein the layer containing the organic compound is formed over a curved surface of a side wall of the first insulating film,
wherein the layer containing the organic compound is in contact with a side wall of the second insulating film,
wherein the layer containing the organic compound is overlapped with an upper surface of the bit line,
wherein the second opening is wider than the first opening,
wherein the width of the word line is wider than the second opening,
wherein the layer containing the organic compound is on and in direct contact with both a part of the bit line and a part of the word line, and
wherein the bit line comprises a tapered shape of conductive material.

2. A memory device comprising:
a first wiring extending in a first direction,
an insulating film over the first wiring, an opening reaching the first wiring in the insulating film,
a second wiring extending in a second direction that is extended across the first direction over the insulating film, and
a layer containing an organic compound over one side surface of the second wiring and the opening,
wherein the layer containing the organic compound is formed over a curved surface of a side wall of the insulating film,
wherein the end portion of the layer containing the organic compound is formed over an upper surface of the insulating film,
wherein the opening is filled with the layer containing the organic compound,
wherein the width of the first wiring is wider than the opening,
wherein the layer containing the organic compound is on and in direct contact with both a part of the first wiring and a part of the second wiring, and
wherein the second wiring comprises a tapered shape of conductive material.

3. A memory device comprising:
a first electrode,
an insulating film formed over the first electrode,
an opening reaching the first electrode in the insulating film,
a second electrode formed over the insulating film, and
a layer containing an organic compound over the second electrode and the opening over the insulating film,
wherein the layer containing the organic compound is formed over a curved surface of a side wall of the insulating film,
wherein the end portion of the layer containing the organic compound is formed over an upper surface of the insulating film,
wherein the layer containing the organic compound has a concave shape,
wherein the width of the first wiring is wider than the opening,
wherein the layer containing the organic compound is on and in direct contact with both a part of the first electrode and a part of the second electrode, and
wherein the second electrode comprises a tapered shape of conductive material.

* * * * *